United States Patent
Masuoka et al.

(10) Patent No.: US 8,664,063 B2
(45) Date of Patent: Mar. 4, 2014

(54) METHOD OF PRODUCING A SEMICONDUCTOR DEVICE AND SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/690,308

(22) Filed: Nov. 30, 2012

(65) Prior Publication Data

US 2013/0146964 A1    Jun. 13, 2013

Related U.S. Application Data

(60) Provisional application No. 61/569,928, filed on Dec. 13, 2011.

(51) Int. Cl.
*H01L 21/336* (2006.01)
*H01L 29/66* (2006.01)

(52) U.S. Cl.
USPC .......................................... 438/266; 257/329

(58) Field of Classification Search
USPC .......................................... 438/266; 257/329
See application file for complete search history.

(56) References Cited

U.S. PATENT DOCUMENTS

| | | | |
|---|---|---|---|
| 6,114,725 A * | 9/2000 | Furukawa et al. | 257/330 |
| 7,115,476 B1 | 10/2006 | Izumida | |
| 7,781,817 B2 * | 8/2010 | Zhu et al. | 257/302 |
| 8,080,458 B2 | 12/2011 | Masuoka et al. | |
| 8,211,758 B2 * | 7/2012 | Masuoka et al. | 438/156 |
| 8,395,208 B2 * | 3/2013 | Masuoka et al. | 257/329 |
| 8,519,475 B2 * | 8/2013 | Masuoka et al. | 257/329 |
| 2010/0187600 A1 * | 7/2010 | Masuoka et al. | 257/329 |
| 2010/0207201 A1 * | 8/2010 | Masuoka et al. | 257/329 |
| 2010/0213525 A1 * | 8/2010 | Masuoka et al. | 257/306 |
| 2010/0213539 A1 * | 8/2010 | Masuoka et al. | 257/329 |
| 2010/0219483 A1 * | 9/2010 | Masuoka et al. | 257/369 |
| 2010/0264484 A1 * | 10/2010 | Masuoka et al. | 257/329 |
| 2010/0264485 A1 * | 10/2010 | Masuoka et al. | 257/329 |
| 2011/0042740 A1 * | 2/2011 | Masuoka et al. | 257/329 |

FOREIGN PATENT DOCUMENTS

| | | |
|---|---|---|
| JP | 02-071556 A | 3/1990 |
| JP | 02-188966 A | 7/1990 |
| JP | 03-145761 A | 6/1991 |

(Continued)

*Primary Examiner* — Lex Malsawma
(74) *Attorney, Agent, or Firm* — Laurence A. Greenberg; Werner H. Stemer; Ralph E. Locher

(57) ABSTRACT

A method for producing a semiconductor device includes the steps of forming a planar silicon layer, first and second pillar-shaped silicon layers on a silicon substrate; forming a gate insulating film, depositing a metal film and a polysilicon around the gate insulating film, conducting planarization, conducting etching to expose upper portions of the first and second pillar-shaped silicon layers, forming first and second insulating film sidewalls, and forming first and second gate electrodes and a gate line; forming n-type diffusion layers in upper and lower portions of the first pillar-shaped silicon layer, and forming p-type diffusion layers in upper and lower portions of the second pillar-shaped silicon layer; forming a third insulating film sidewall on side walls of the first and second insulating film sidewalls, the first and second gate electrodes, and the gate line; and forming a silicide.

6 Claims, 48 Drawing Sheets

(56) References Cited

FOREIGN PATENT DOCUMENTS

| | | |
|---|---|---|
| JP | 2006-310651 A | 11/2006 |
| JP | 2009-182317 A | 8/2009 |
| JP | 2010-251678 A | 11/2010 |
| WO | 2009/096468 A1 | 8/2009 |

* cited by examiner

FIG. 6
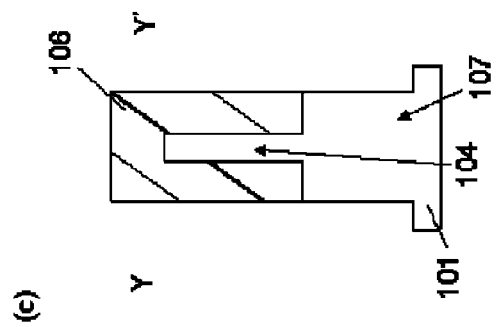
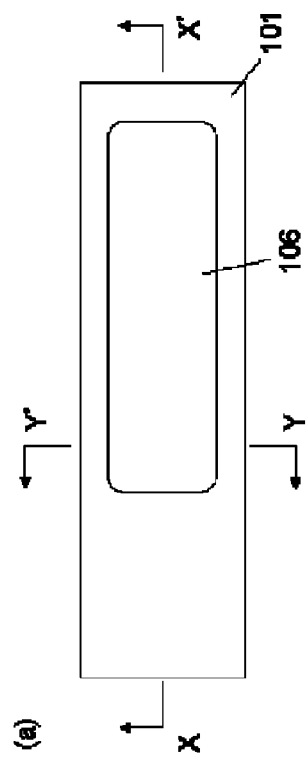
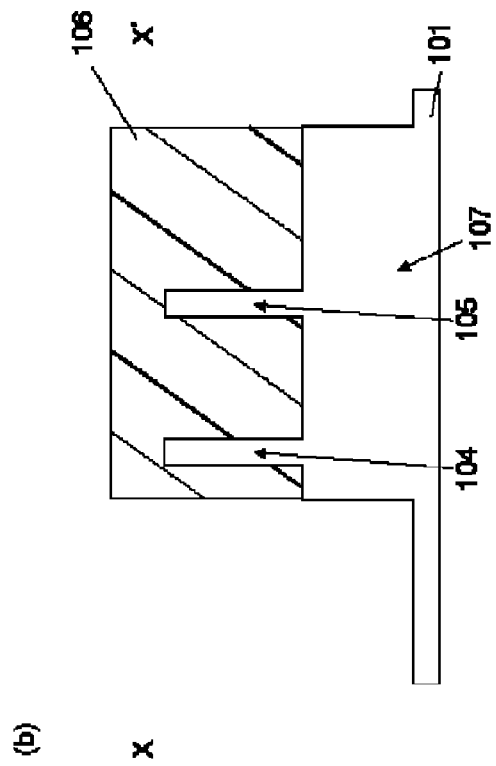

FIG. 10
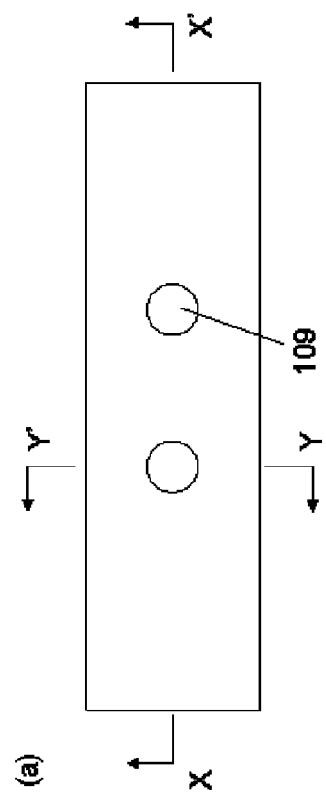
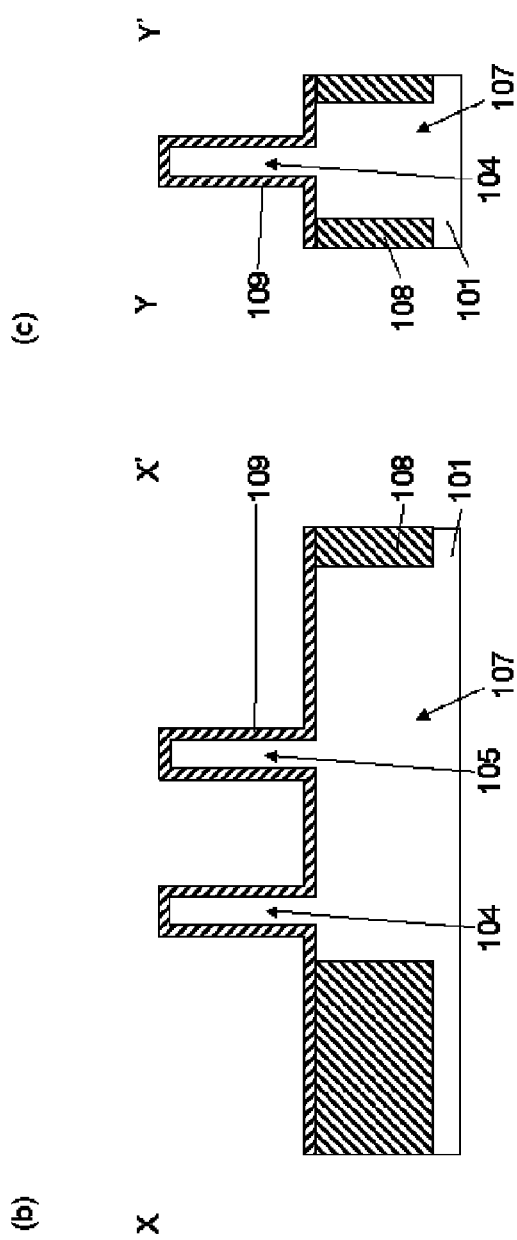

FIG. 11
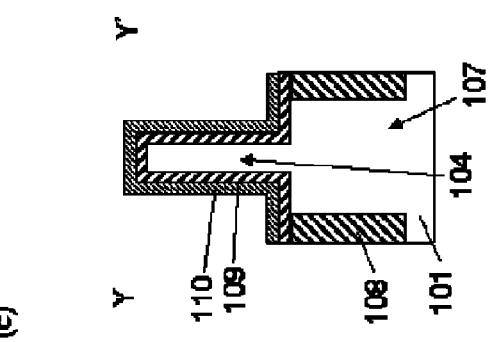
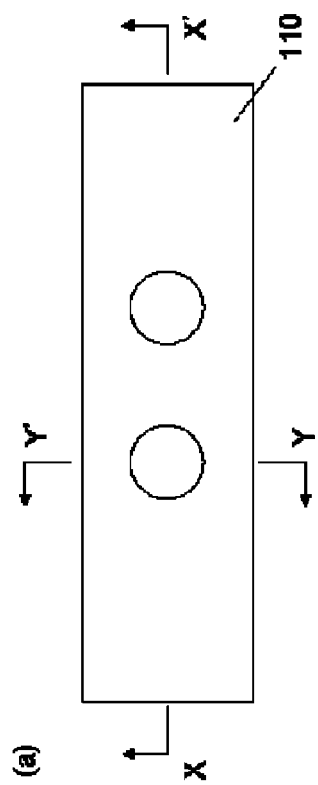
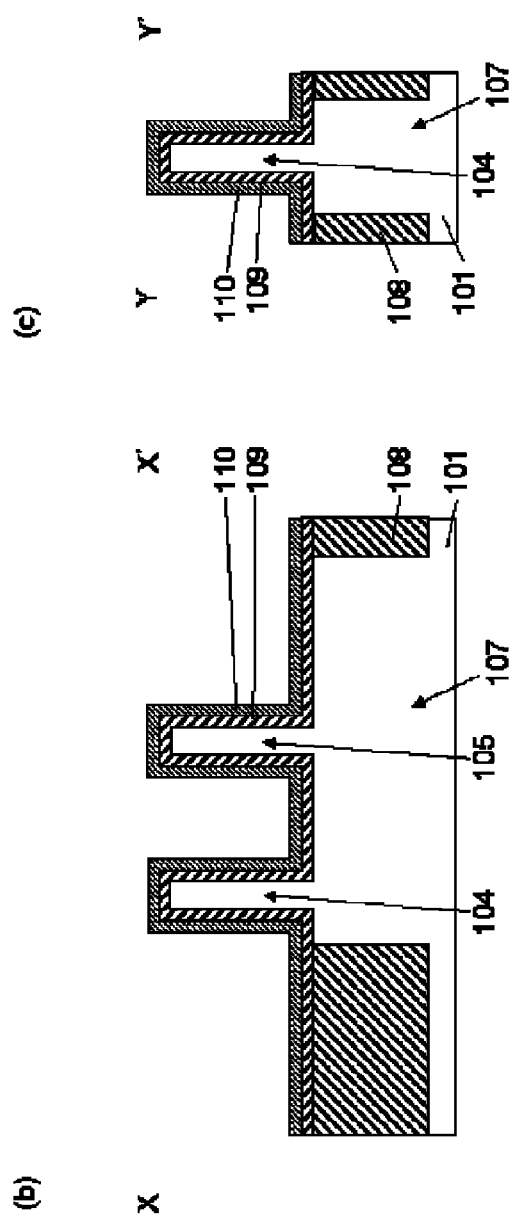

FIG. 12
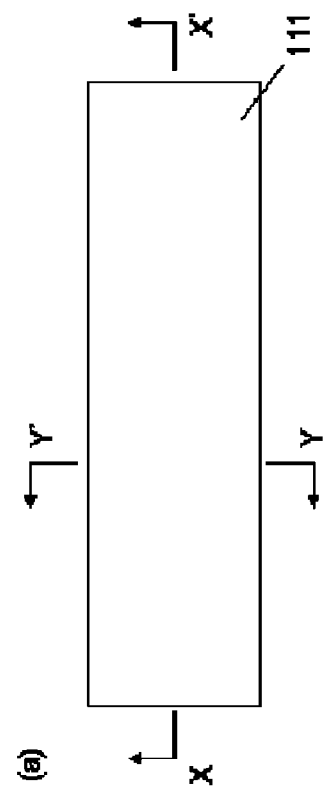
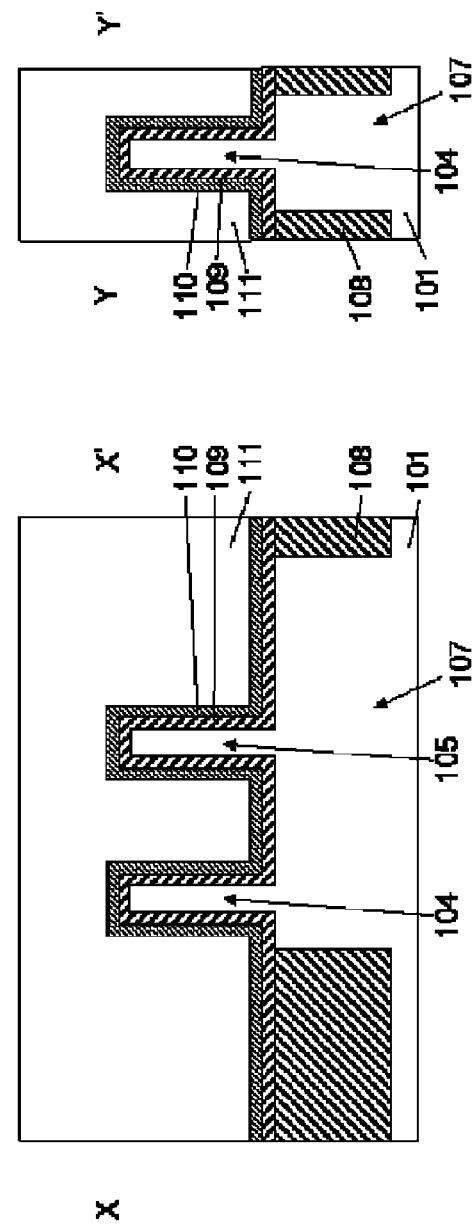

FIG. 13
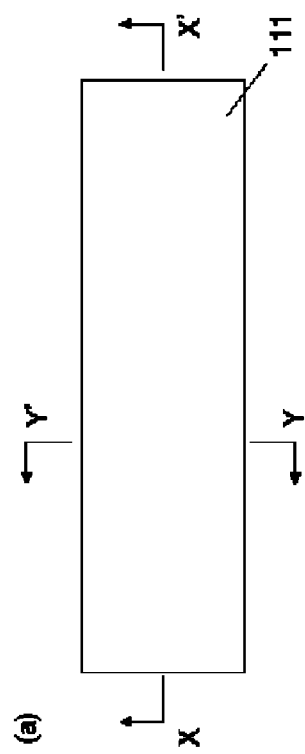
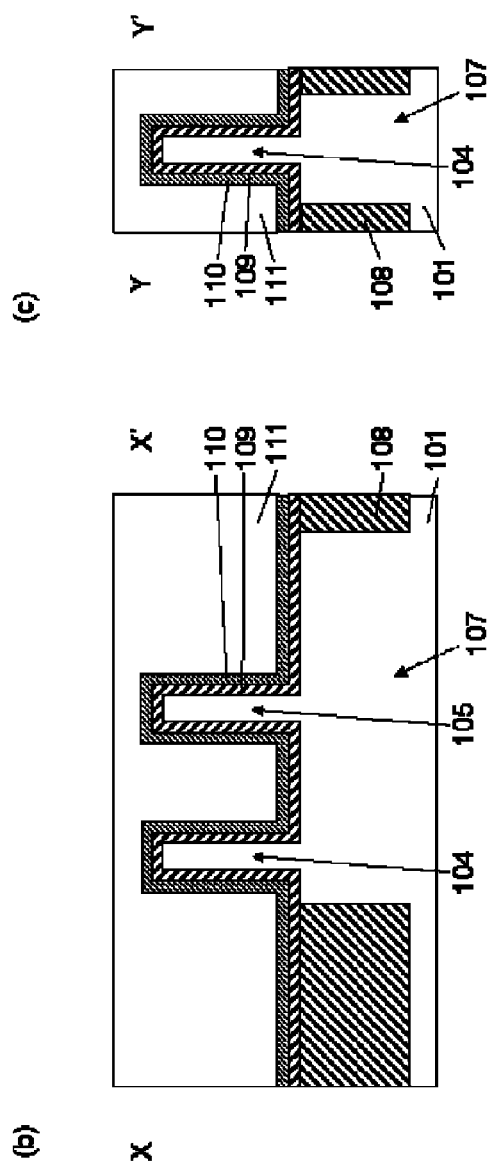

FIG. 14
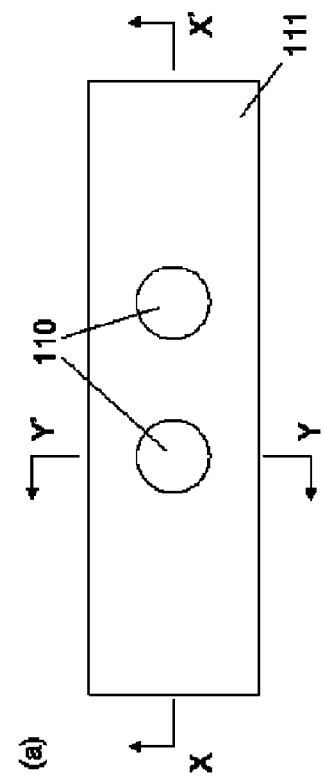
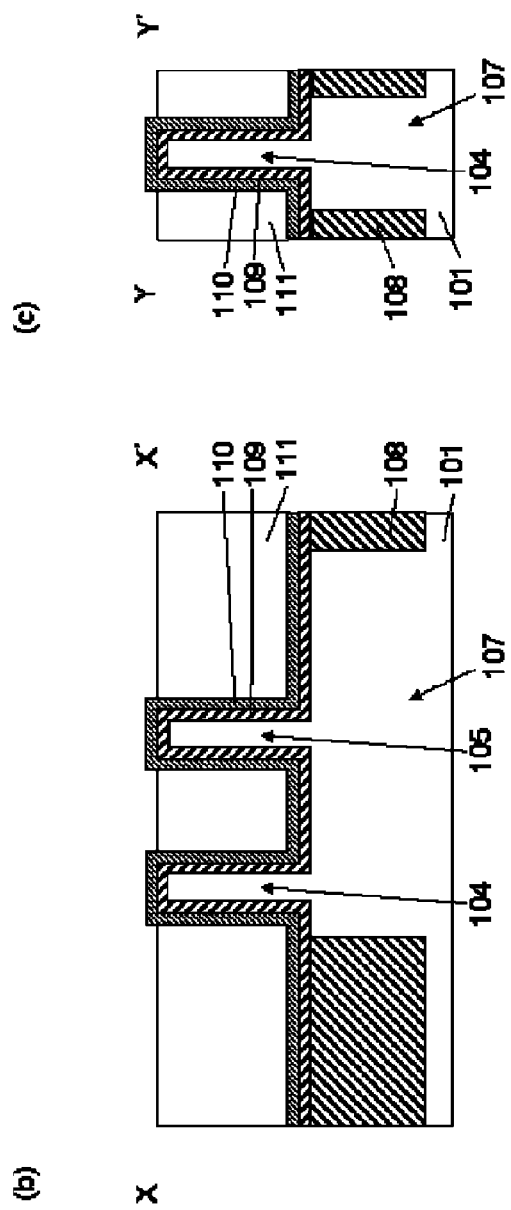

FIG. 15
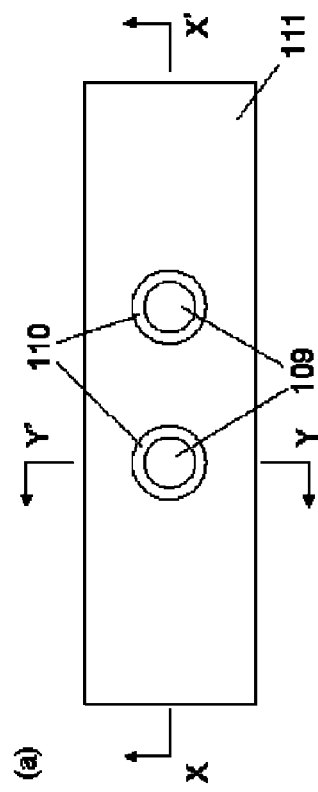
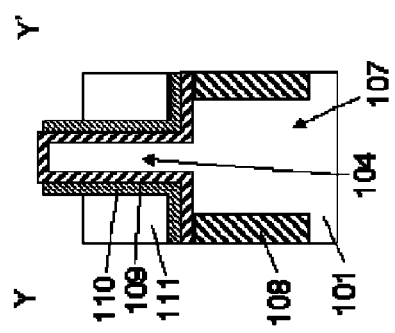
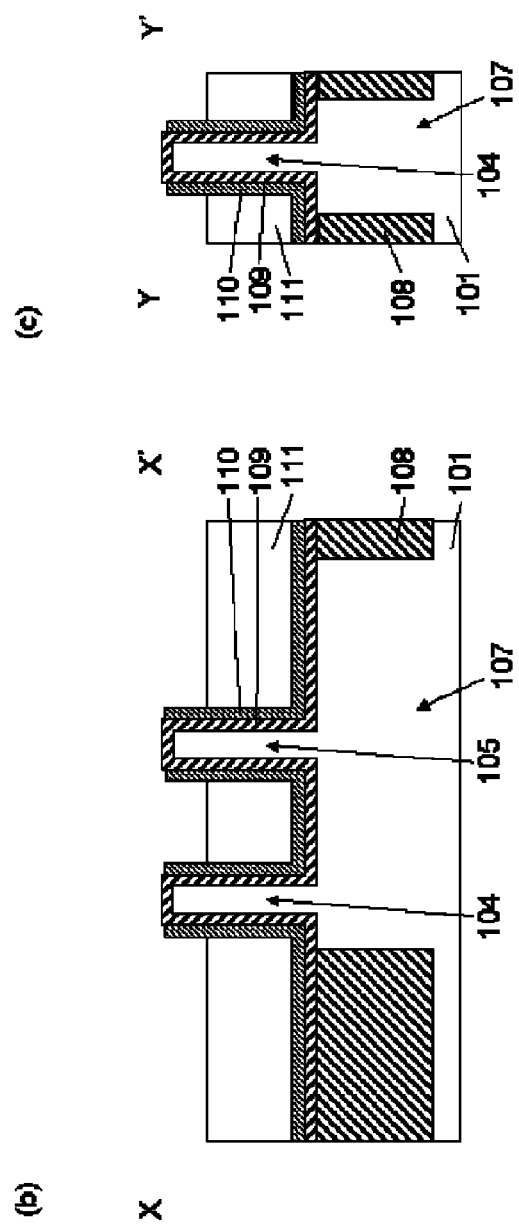

FIG. 16
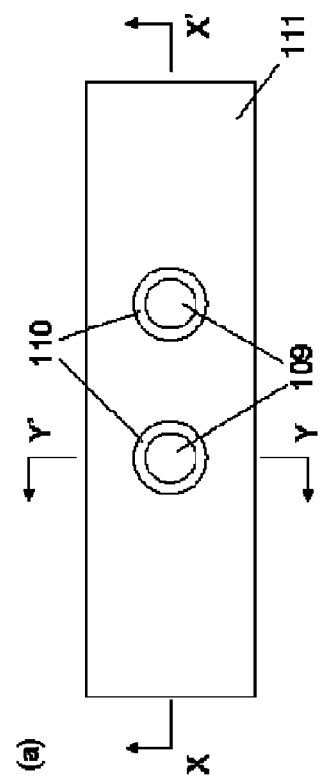
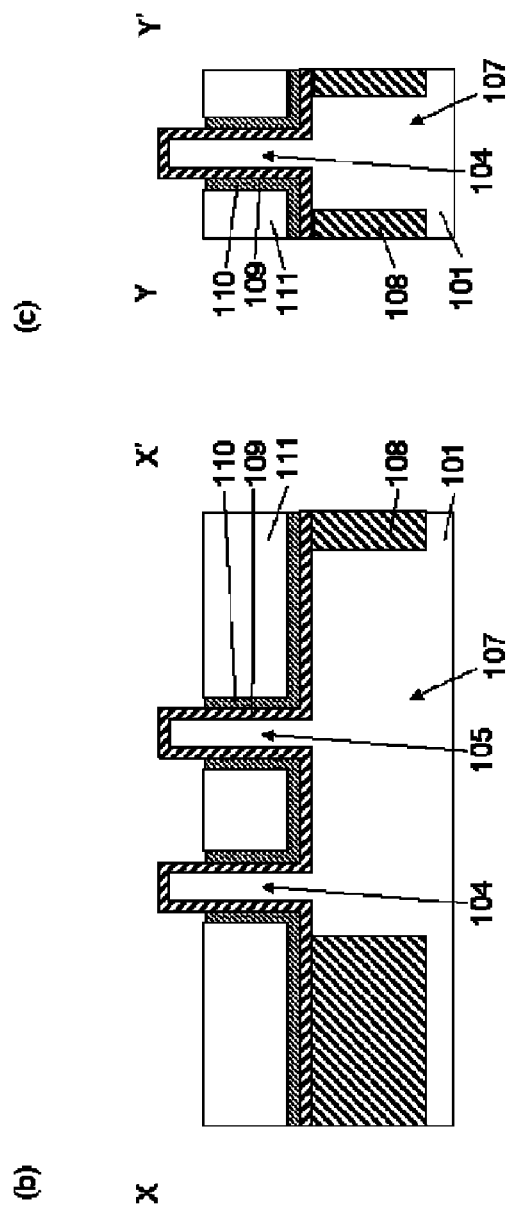

FIG. 17
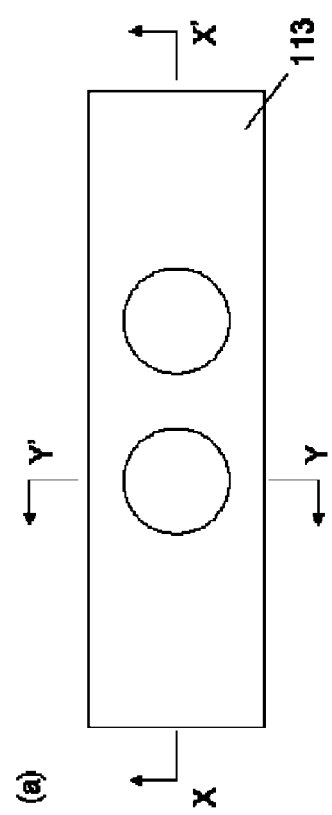
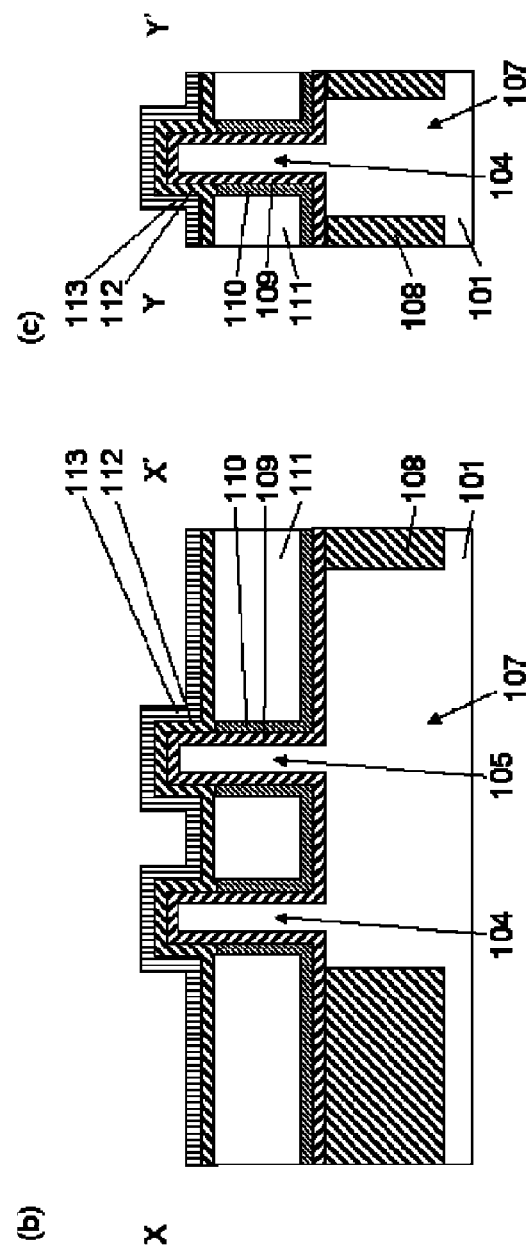

FIG. 18
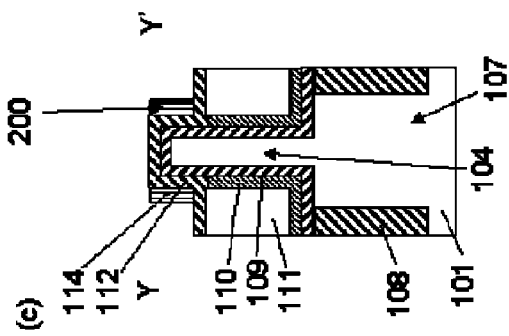
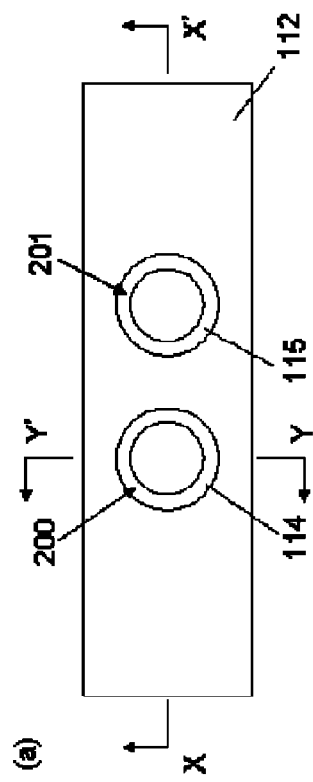
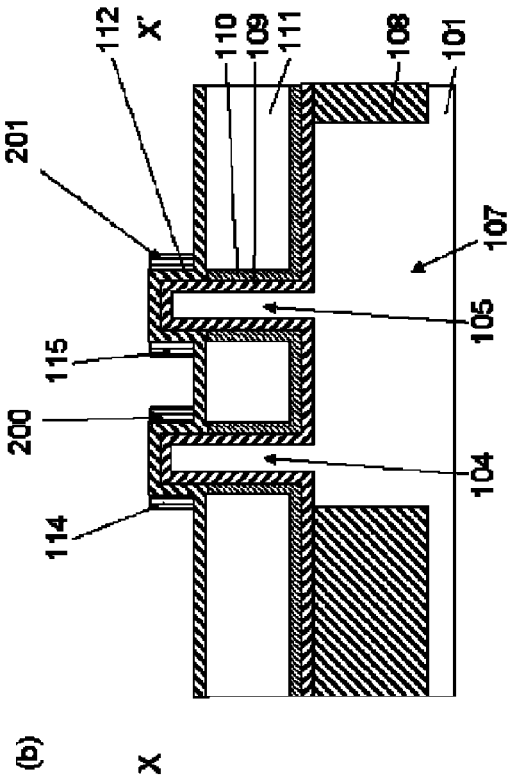

FIG. 23
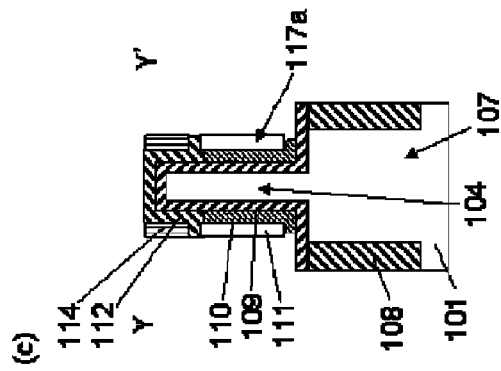
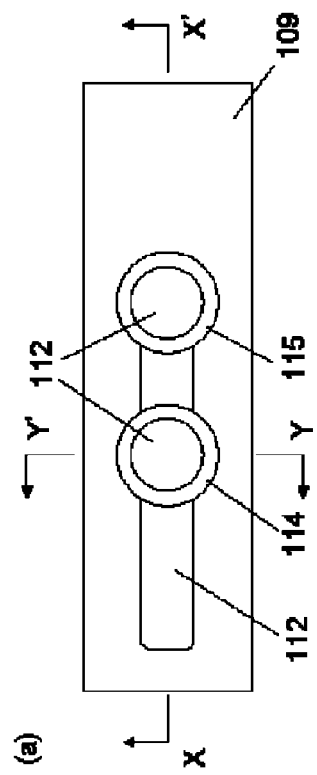
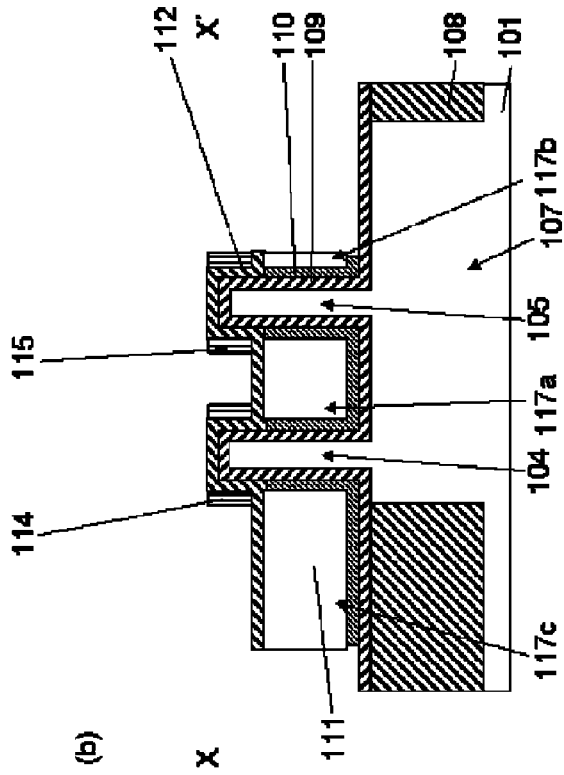

FIG. 28
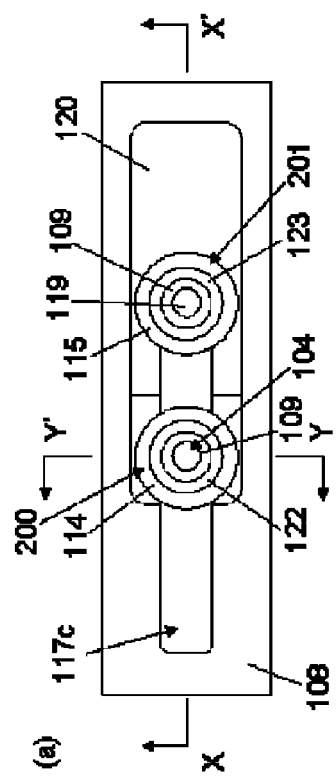
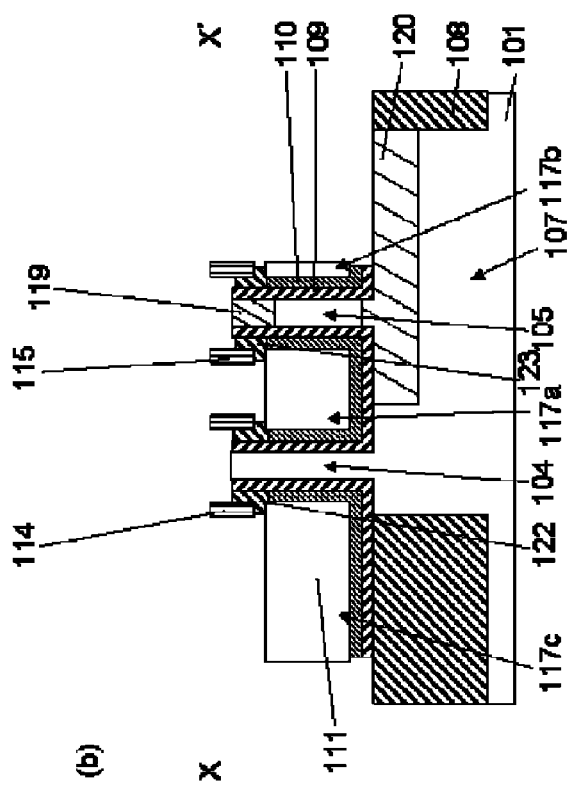
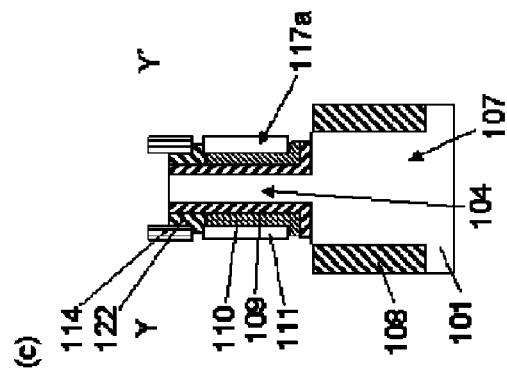

FIG. 31
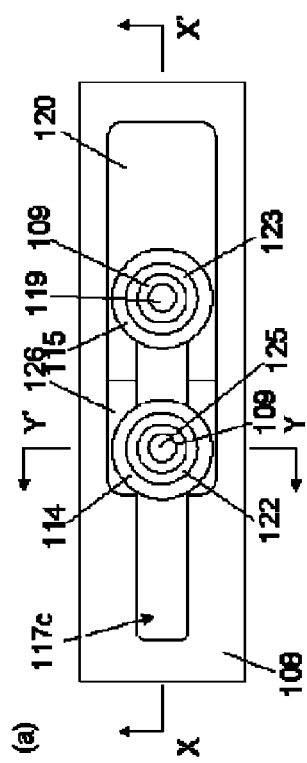
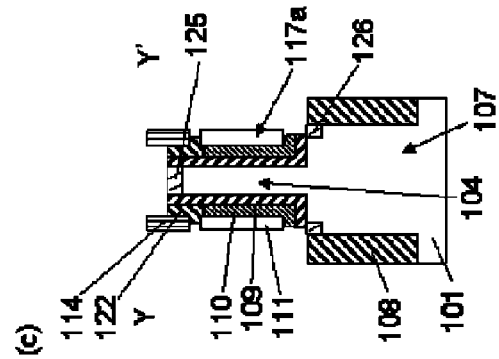
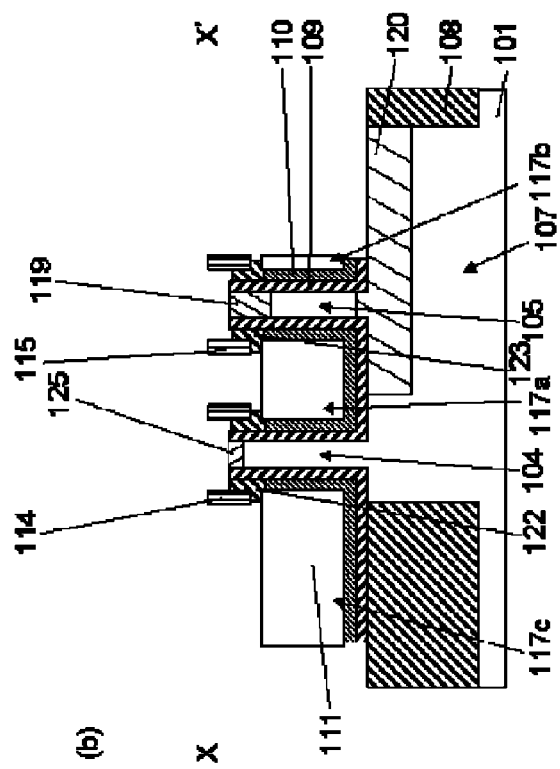

FIG. 33
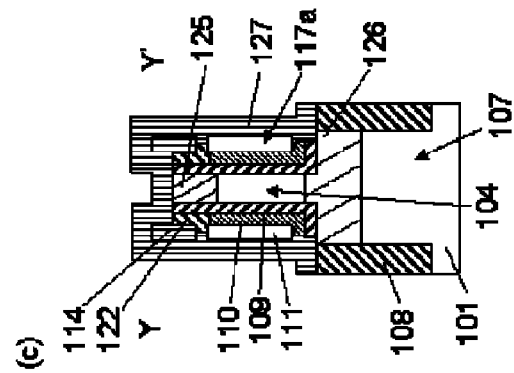
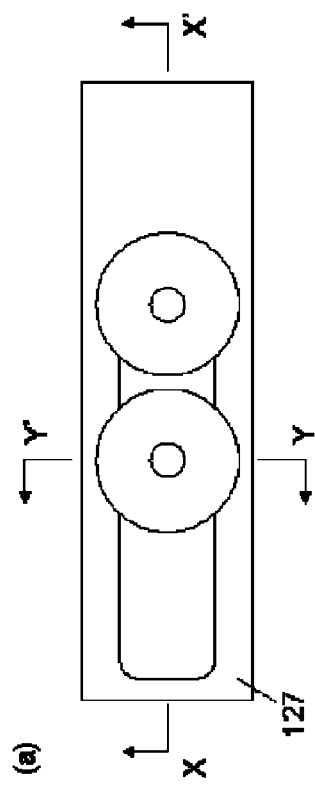
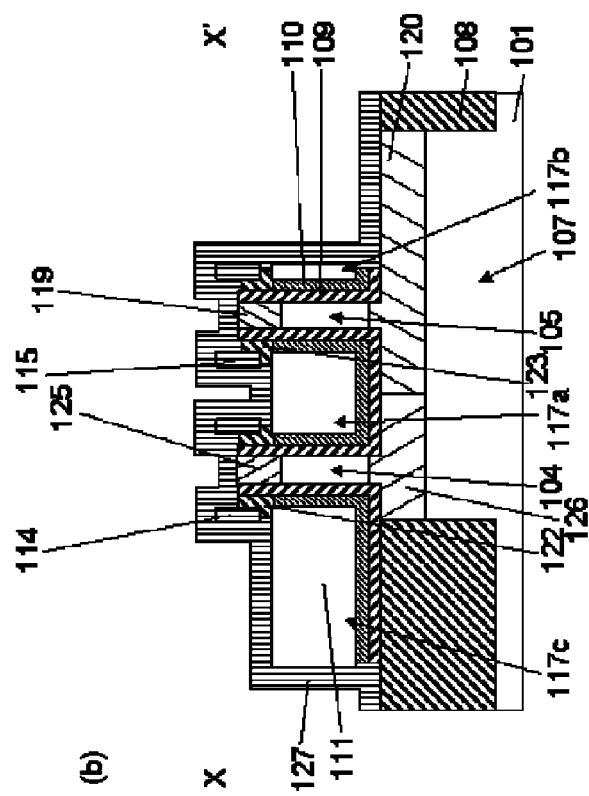

FIG. 34
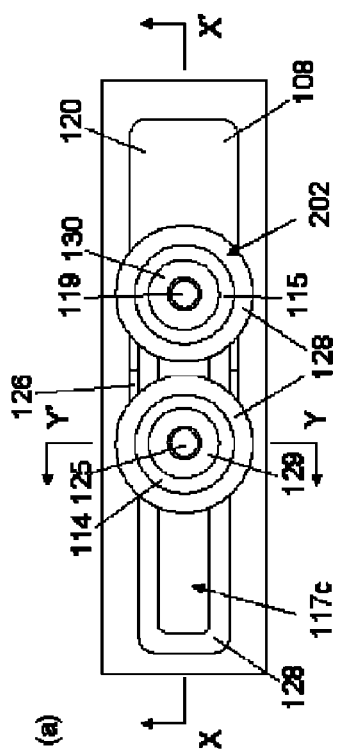
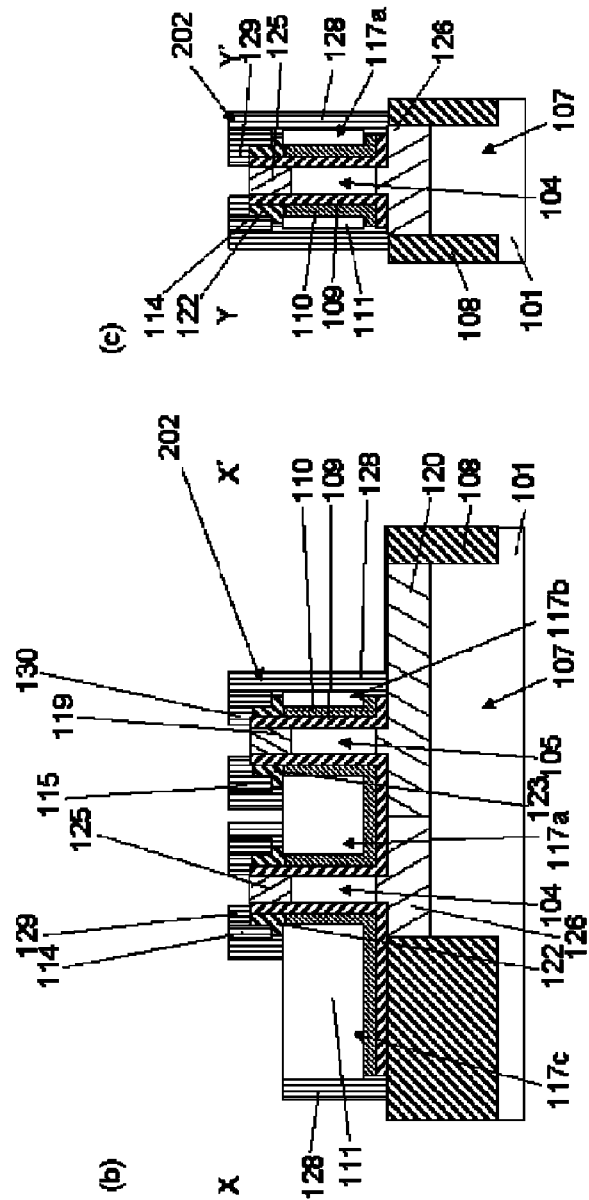

FIG. 35
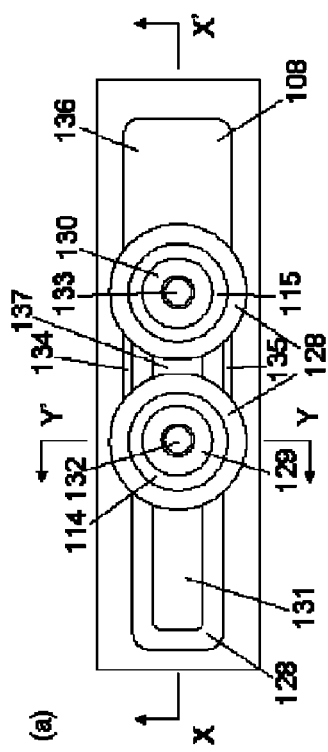
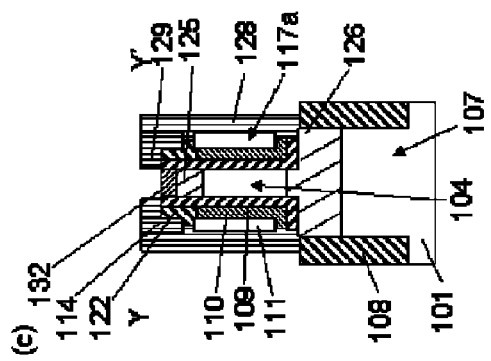
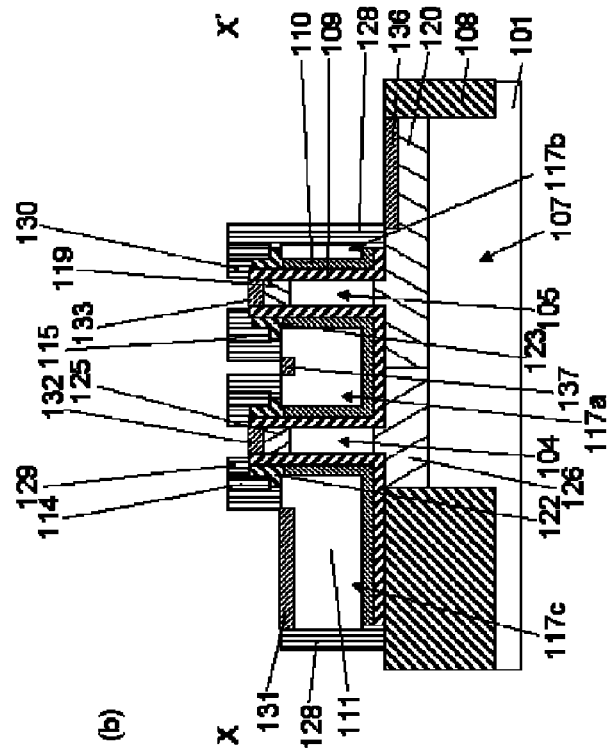

FIG. 37
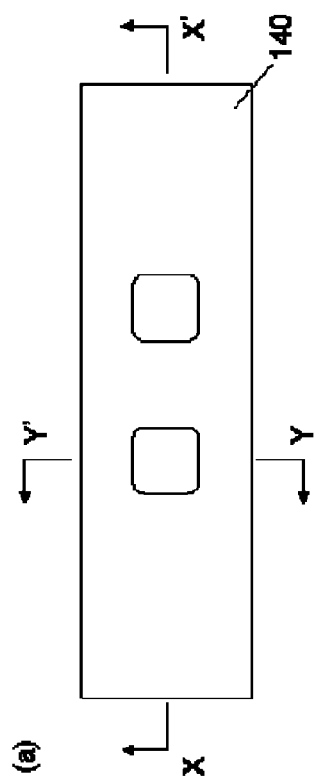
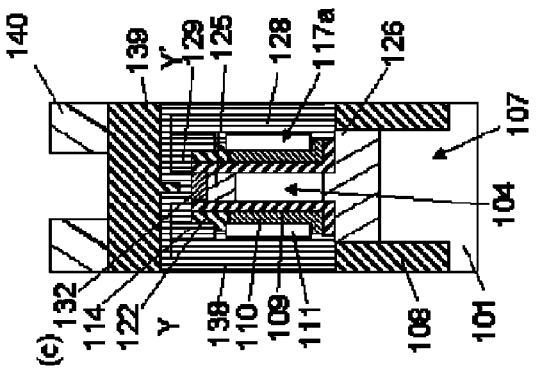
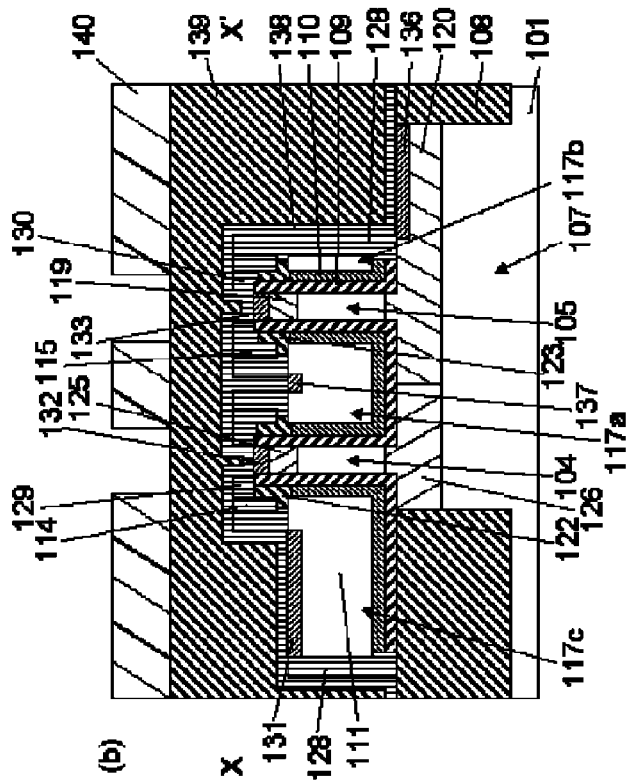

FIG. 38
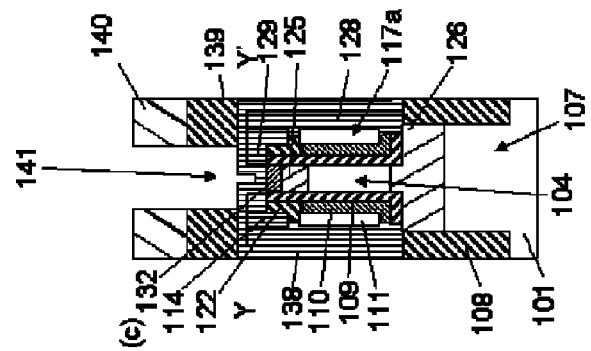
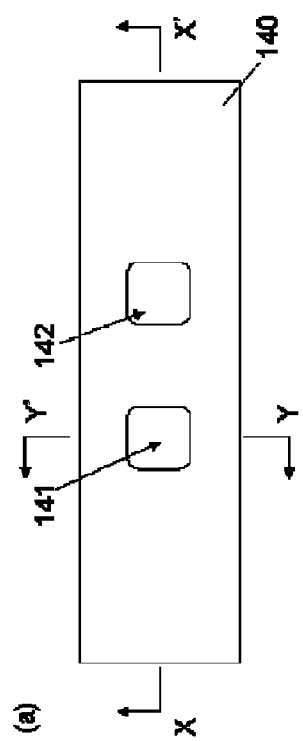
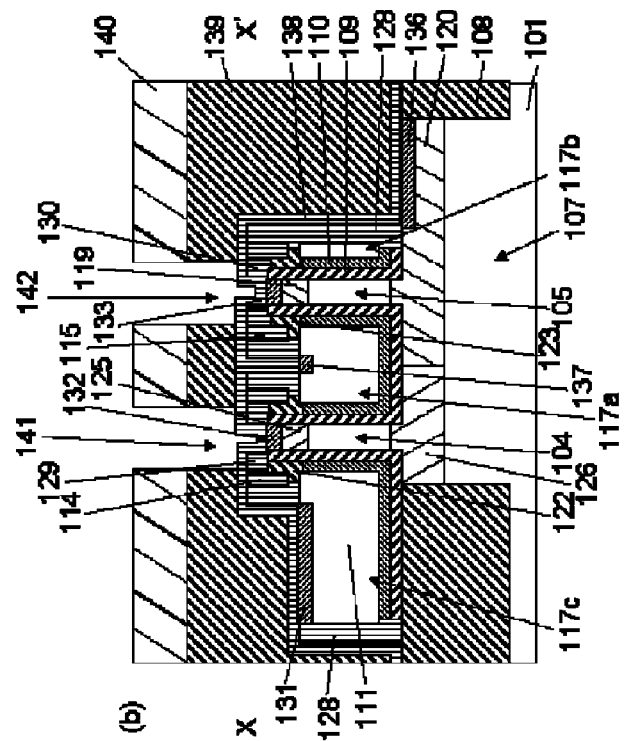

FIG. 42
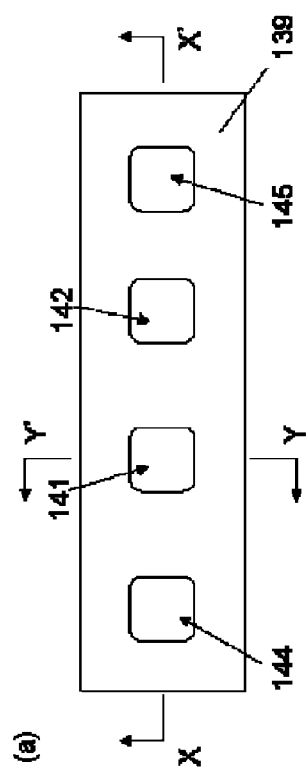
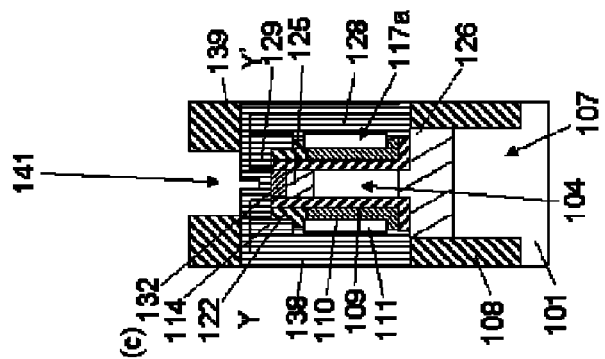
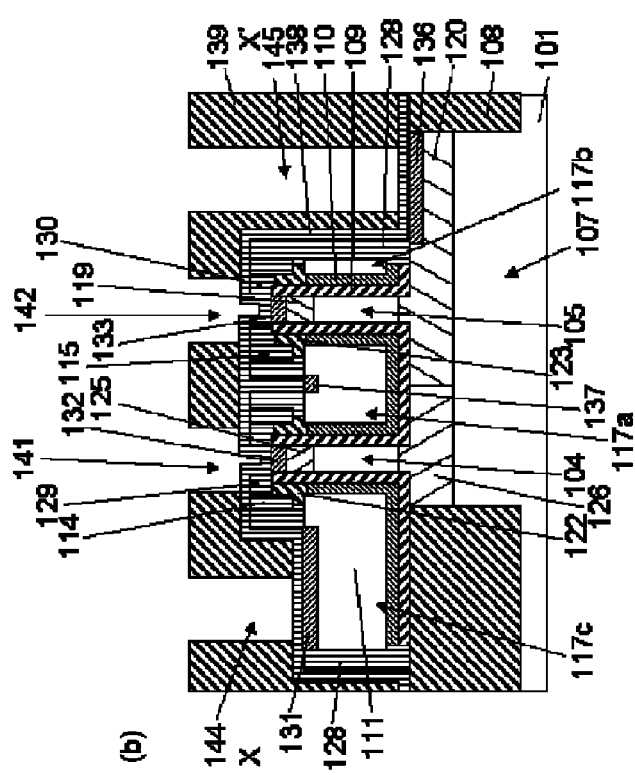

FIG. 46
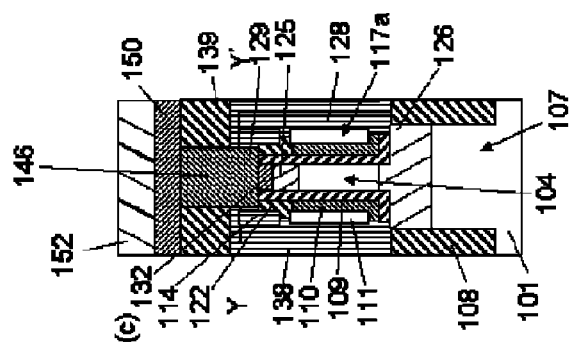
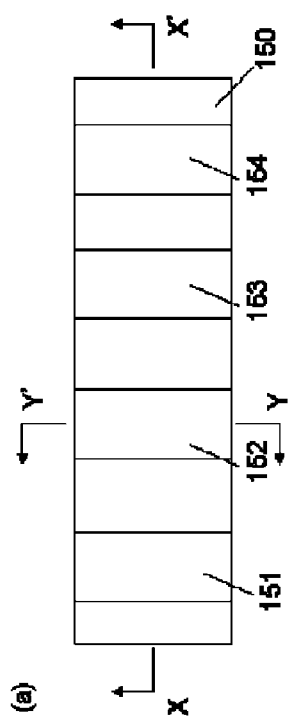
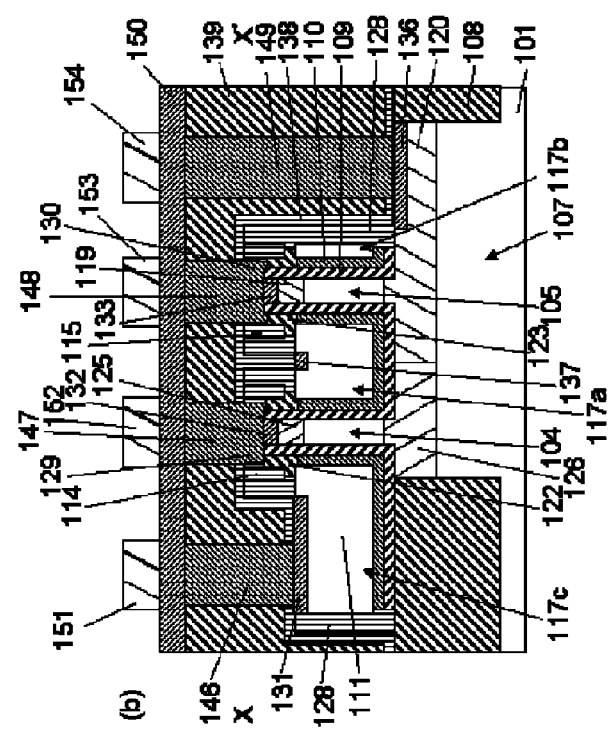

FIG. 48
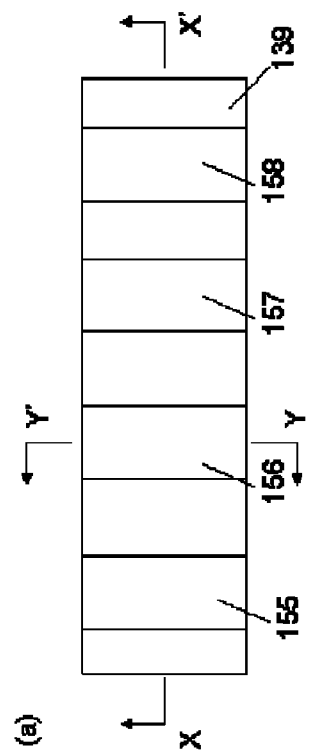
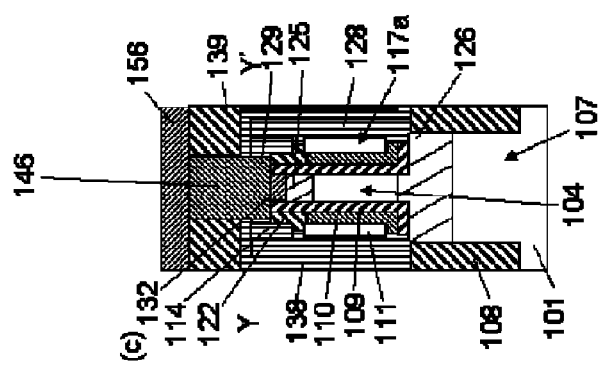
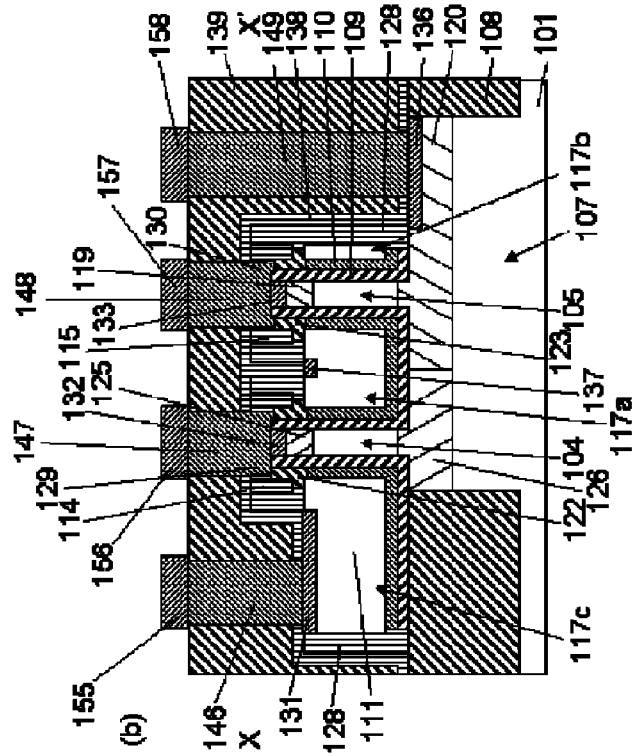

METHOD OF PRODUCING A SEMICONDUCTOR DEVICE AND SEMICONDUCTOR DEVICE

CROSS REFERENCES TO RELATED APPLICATIONS

This application claims the benefit, under 35 U.S.C. §119 (e), of provisional patent application No. 61/569,928, filed on Dec. 13, 2011; the entire content of the prior application is herewith incorporated by reference.

BACKGROUND OF THE INVENTION

1. Field of the Invention

The invention lies in the fields of semiconductors and semiconductor manufacture. The present invention relates to a method for producing a semiconductor device and to a semiconductor device.

2. Description of the Related Art

The degree of integration of semiconductor integrated circuits, in particular, integrated circuits using MOS transistors has been increasing. With this realization of high integration, MOS transistors used in such integrated circuits have been miniaturized to the nano-scale. With the progress of such miniaturization of MOS transistors, there has been a problem in that it is difficult to suppress a leak current and the area occupied by circuits cannot be easily decreased from the standpoint of the requirement for ensuring a necessary amount of current. In order to solve this problem, a surrounding gate transistor (hereinafter referred to as "SGT") has been proposed in which a source, a gate, and a drain are arranged in a perpendicular direction with respect to a substrate, and a gate electrode surrounds a pillar-shaped semiconductor layer (refer to, for example, Japanese unexamined patent application publications Nos. 2-71556, 2-188966, and 3-145761)

According to that technology, by using, as a gate electrode, a metal rather than a polysilicon, depletion can be suppressed and the resistance of the gate electrode can be lowered. However, in production steps after the formation of a metal gate, it is necessary to constantly consider metal contamination due to the metal gate.

In an existing method for producing an SGT, a silicon pillar on which a nitride film hard mask is formed in a pillar shape is formed, a diffusion layer is formed in a lower portion of the silicon pillar, a gate material is then deposited, the gate material is then planarized and etched back, and an insulating film sidewall is formed on the side wall of the silicon pillar and the nitride film hard mask. Subsequently, a resist pattern for forming a gate line is formed, the gate material is etched, the nitride film hard mask is then removed, and a diffusion layer is formed in an upper portion of the silicon pillar (refer to, for example, Japanese unexamined patent application publication No. 2009-182317).

In that method, a diffusion layer in a lower portion of a silicon pillar is formed, a gate electrode is then formed, and a diffusion layer is formed in an upper portion of the silicon pillar. Since the diffusion rate of boron is high and the diffusion rate of arsenic is low, when a so-called complementary metal oxide semiconductor (CMOS) SGT is formed, it is difficult to conduct optimum heat treatment on both a negative-channel metal oxide semiconductor (NMOS) and a positive-channel metal oxide semiconductor (PMOS). Accordingly, the diffusion layer in the lower portion of the silicon pillar and the diffusion layer in the upper portion thereof are separately formed and the nitride film hard mask is removed, and thus the number of steps is increased.

In another existing method for producing an SGT, a silicon pillar is formed, and a diffusion layer is then formed in each of an upper portion and a lower portion of the silicon pillar, and a gate material is deposited. Subsequently, the gate material is planarized and etched back, an insulating film sidewall is formed on the side wall of the silicon pillar. Subsequently, the gate material is etched to form a floating gate, and the insulating film sidewall is then removed (refer to, for example, Japanese unexamined patent application publication No. 2006-310651).

In that method, in the step of etching the gate material to form the floating gate, only a gate insulating film is provided on the upper portion of the silicon pillar. Consequently, the gate insulating film may be etched during the etching, and thus the silicon pillar may be etched. Furthermore, since the insulating film sidewall is removed after the formation of the floating gate, the number of steps is increased.

SUMMARY OF THE INVENTION

Accordingly, an object of the present invention is to provide a method for producing a semiconductor device (SGT) in which the number of steps is small and an upper portion of a silicon pillar is protected during etching of a gate and a semiconductor device (a structure of an SGT).

A method for producing a semiconductor device according to a first aspect of the present invention includes a first step of forming a planar silicon layer on a silicon substrate, and forming a first pillar-shaped silicon layer and a second pillar-shaped silicon layer on the planar silicon layer; a second step of, after the first step, forming a gate insulating film around the first and second pillar-shaped silicon layers, depositing a metal film and a polysilicon around the gate insulating film, conducting planarization, and conducting etching to expose upper portions of the first and second pillar-shaped silicon layers, forming a first insulating film sidewall on an upper side wall of the first pillar-shaped silicon layer, forming a second insulating film sidewall on an upper side wall of the second pillar-shaped silicon layer, forming, around the gate insulating film, a first gate electrode and a second gate electrode each having a laminated structure of the metal film and the polysilicon, and forming a gate line connected to the first gate electrode and the second gate electrode; a third step of, after the second step, forming a first n-type diffusion layer in an upper portion of the first pillar-shaped silicon layer, forming a second n-type diffusion layer in a lower portion of the first pillar-shaped silicon layer and an upper portion of the planar silicon layer, forming a first p-type diffusion layer in an upper portion of the second pillar-shaped silicon layer, and forming a second p-type diffusion layer in a lower portion of the second pillar-shaped silicon layer and an upper portion of the planar silicon layer; a fourth step of, after the third step, forming a third insulating film sidewall on side walls of the first and second insulating film sidewalls, side walls of the first and second gate electrodes, and a side wall of the gate line; and a fifth step of, after the fourth step, forming a silicide on the first and second n-type diffusion layers, the first and second p-type diffusion layers, and the gate line.

Preferably, a first resist for forming the first and second pillar-shaped silicon layers is formed on the silicon substrate, the silicon substrate is etched to form the first and second pillar-shaped silicon layers, the first resist is removed, a second resist for forming the planar silicon layer is formed, the silicon substrate is etched to form the planar silicon layer, and the second resist is removed.

Preferably, in a structure including the planar silicon layer formed on the silicon substrate, the first pillar-shaped silicon layer formed on the planar silicon layer, the second pillar-shaped silicon layer formed on the planar silicon layer, and a first insulating film formed around the planar silicon layer, the gate insulating film is formed around the first and second pillar-shaped silicon layers; a metal film is formed around the gate insulating film, a polysilicon is deposited and planarized, the polysilicon is etched to expose the metal film, and the polysilicon is etched to expose upper portions of the first and second pillar-shaped silicon layers; the metal film is etched, a second oxide film and a first nitride film are deposited, and the first nitride film is etched to remain in a sidewall shape to form a nitride film sidewall; the second oxide film and the nitride film sidewall function as the first and second insulating film sidewalls; in order to form the first and second gate electrodes and the gate line, a third resist is formed so as to cover upper portions of the first and second pillar-shaped silicon layers; and the second oxide film is etched, the polysilicon is etched, and the metal film is etched to form the first and second gate electrodes and the gate line, and the third resist is then removed.

Preferably, a fourth resist for forming a first n-type diffusion layer and a second n-type diffusion layer is formed, arsenic is implanted to form the first and second n-type diffusion layers, the fourth resist is removed, a third oxide film is deposited, and heat treatment is then conducted; the third oxide film is removed, the second oxide film and the gate insulating film are etched such that the second oxide film remains around the first and second pillar-shaped silicon layers to function as an oxide film sidewall; the oxide film sidewall and the nitride film sidewall function as the first insulating film sidewall, and the oxide film sidewall and the nitride film sidewall function as the second insulating film sidewall; and a fifth resist for forming a first p-type diffusion layer and a second p-type diffusion layer is formed, boron is implanted to form the first and second p-type diffusion layers, the fifth resist is removed, and heat treatment is then conducted.

Preferably, a second nitride film is further deposited, and the second nitride film is etched so as to remain in a sidewall shape to form a nitride film sidewall functioning as the third insulating film sidewall.

A semiconductor device according to a second aspect of the present invention includes a planar silicon layer formed on a silicon substrate; first and second pillar-shaped silicon layers formed on the planar silicon layer; a first gate insulating film formed around the first pillar-shaped silicon layer; a first gate electrode having a laminated structure of a metal film and a polysilicon and formed around the first gate insulating film; a second gate insulating film formed around the second pillar-shaped silicon layer; a second gate electrode having a laminated structure of a metal film and a polysilicon and formed around the second gate insulating film; a gate line connected to the first and second gate electrodes; a first n-type diffusion layer formed in an upper portion of the first pillar-shaped silicon layer; a second n-type diffusion layer formed in a lower portion of the first pillar-shaped silicon layer and in an upper portion of the planar silicon layer; a first p-type diffusion layer formed in an upper portion of the second pillar-shaped silicon layer; a second p-type diffusion layer formed in a lower portion of the second pillar-shaped silicon layer and in an upper portion of the planar silicon layer; a first insulating film sidewall formed on an upper side wall of the first pillar-shaped silicon layer and on an upper portion of the first gate electrode; a second insulating film sidewall formed on an upper side wall of the second pillar-shaped silicon layer and on an upper portion of the second gate electrode; a third insulating film sidewall formed on side walls of the first and second insulating film sidewalls, side walls of the first and second gate electrodes, and a side wall of the gate line; and a silicide formed on the first and second n-type diffusion layers, the first and second p-type diffusion layers, and the gate line.

According to the present invention, it is possible to provide a method for producing a semiconductor device (SGT) in which the number of steps is small and an upper portion of a silicon pillar is protected during etching of a gate and a semiconductor device (a structure of an SGT). Since a diffusion layer in a lower portion of a silicon pillar and a diffusion layer in an upper portion of the silicon pillar are formed at the same time, the number of steps can be reduced. Furthermore, in order to form first and second gate electrodes and a gate line, a third resist is formed so as to cover an upper portion of a first pillar-shaped silicon layer and an upper portion of a second pillar-shaped silicon layer. Since the upper portions of the first and second pillar-shaped silicon layers are covered with the third resist, it is possible to prevent a gate insulating film from being etched during etching and thus to prevent the pillar-shaped silicon layers from being etched.

An upper portion of the first gate electrode is covered with a first insulating film sidewall and the side wall of the first gate electrode is coveted with a third insulating film sidewall. The side wall of the first insulating film sidewall is covered with the third insulating film sidewall. Accordingly, if the position of a contact formed on a diffusion layer in an upper portion of a planar silicon layer is shifted to the first gate electrode side, a short-circuit between the first gate electrode and the contact can be prevented. Similarly, an upper portion of the second gate electrode is covered with a second insulating film sidewall, and the side wall of the second gate electrode is covered with the third insulating film sidewall. In addition, the side wall of the second insulating film sidewall is covered with the third insulating film sidewall. Accordingly, in the case where a contact formed on a diffusion layer in an upper portion of the planar silicon layer is formed in the vicinity of the second gate electrode and the position of the contact is shifted to the second gate electrode side, a short-circuit between the second gate electrode and the contact can be prevented.

Other features which are considered as characteristic for the invention are set forth in the appended claims.

Although the invention is illustrated and described herein as embodied in a method for producing semiconductor device and semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 6(a) is a plan view illustrating the method for producing a semiconductor device according to the embodiment;

FIG. 6(b) is a cross-sectional view taken along line X-X' of FIG. 6(a);

FIG. 6(c) is a cross-sectional view taken along line Y-Y' of FIG. 6(a);

FIG. 10(a) is a plan view illustrating the method for producing a semiconductor device according to the embodiment;

FIG. 10(b) is a cross-sectional view taken along line X-X' of FIG. 10(a);

FIG. 10(c) is a cross-sectional view taken along line Y-Y' of FIG. 10(a);

FIG. 11(a) is a plan view illustrating the method for producing a semiconductor device according to the embodiment;

FIG. 11(b) is a cross-sectional view taken along line X-X' of FIG. 11(a);

FIG. 11(c) is a cross-sectional view taken along line Y-Y' of FIG. 11(a);

FIG. 12(a) is a plan view illustrating the method for producing a semiconductor device according to the embodiment;

FIG. 12(b) is a cross-sectional view taken along line X-X' of FIG. 12(a);

FIG. 12(c) is a cross-sectional view taken along line Y-Y' of FIG. 12(a);

FIG. 13(a) is a plan view illustrating the method for producing a semiconductor device according to the embodiment;

FIG. 13(b) is a cross-sectional view taken along line X-X' of FIG. 13(a);

FIG. 13(c) is a cross-sectional view taken along line Y-Y' of FIG. 13(a);

FIG. 14(a) is a plan view illustrating the method for producing a semiconductor device according to the embodiment;

FIG. 14(b) is a cross-sectional view taken along line X-X' of FIG. 14(a);

FIG. 14(c) is a cross-sectional view taken along line Y-Y' of FIG. 14(a);

FIG. 15(a) is a plan view illustrating the method for producing a semiconductor device according to the embodiment;

FIG. 15(b) is a cross-sectional view taken along line X-X' of FIG. 15(a);

FIG. 15(c) is a cross-sectional view taken along line Y-Y' of FIG. 15(a);

FIG. 16(a) is a plan view illustrating the method for producing a semiconductor device according to the embodiment;

FIG. 16(b) is a cross-sectional view taken along line X-X' of FIG. 16(a);

FIG. 16(c) is a cross-sectional view taken along line Y-Y' of FIG. 16(a);

FIG. 17(a) is a plan view illustrating the method for producing a semiconductor device according to the embodiment;

FIG. 17(b) is a cross-sectional view taken along line X-X' of FIG. 17(a);

FIG. 17(c) is a cross-sectional view taken along line Y-Y' of FIG. 17(a);

FIG. 18(a) is a plan view illustrating the method for producing a semiconductor device according to the embodiment;

FIG. 18(b) is a cross-sectional view taken along line X-X' of FIG. 18(a);

FIG. 18(c) is a cross-sectional view taken along line Y-Y' of FIG. 18(a);

FIG. 23(a) is a plan view illustrating the method for producing a semiconductor device according to the embodiment;

FIG. 23(b) is a cross-sectional view taken along line X-X' of FIG. 23(a);

FIG. 23(c) is a cross-sectional view taken along line Y-Y' of FIG. 23(a);

FIG. 28(a) is a plan view illustrating the method for producing a semiconductor device according to the embodiment;

FIG. 28(b) is a cross-sectional view taken along line X-X' of FIG. 28(a);

FIG. 28(c) is a cross-sectional view taken along line Y-Y' of FIG. 28(a);

FIG. 31(a) is a plan view illustrating the method for producing a semiconductor device according to the embodiment;

FIG. 31(b) is a cross-sectional view taken along line X-X' of FIG. 31(a);

FIG. 31(c) is a cross-sectional view taken along line Y-Y' of FIG. 31(a);

FIG. 33(a) is a plan view illustrating the method for producing a semiconductor device according to the embodiment;

FIG. 33(b) is a cross-sectional view taken along line X-X' of FIG. 33(a);

FIG. 33(c) is a cross-sectional view taken along line Y-Y' of FIG. 33(a);

FIG. 34(a) is a plan view illustrating the method for producing a semiconductor device according to the embodiment;

FIG. 34(b) is a cross-sectional view taken along line X-X' of FIG. 34(a);

FIG. 34(c) is a cross-sectional view taken along line Y-Y' of FIG. 34(a);

FIG. 35(a) is a plan view illustrating the method for producing a semiconductor device according to the embodiment;

FIG. 35(b) is a cross-sectional view taken along line X-X' of FIG. 35(a);

FIG. 35(c) is a cross-sectional view taken along line Y-Y' of FIG. 35(a);

FIG. 37(a) is a plan view illustrating the method for producing a semiconductor device according to the embodiment;

FIG. 37(b) is a cross-sectional view taken along line X-X' of FIG. 37(a);

FIG. 37(c) is a cross-sectional view taken along line Y-Y' of FIG. 37(a);

FIG. 38(a) is a plan view illustrating the method for producing a semiconductor device according to the embodiment;

FIG. 38(b) is a cross-sectional view taken along line X-X' of FIG. 38(a);

FIG. 38(c) is a cross-sectional view taken along line Y-Y' of FIG. 38(a);

FIG. 40(c) is a cross-sectional view taken along line Y-Y' of FIG. 40(a);

FIG. 41(a) is a plan view illustrating the method for producing a semiconductor device according to the embodiment;

FIG. 41(b) is a cross-sectional view taken along line X-X' of FIG. 41(a);

FIG. 41(c) is a cross-sectional view taken along line Y-Y' of FIG. 41(a);

FIG. 42(a) is a plan view illustrating the method for producing a semiconductor device according to the embodiment;

FIG. 42(b) is a cross-sectional view taken along line X-X' of FIG. 42(a);

FIG. 42(c) is a cross-sectional view taken along line Y-Y' of FIG. 42(a);

FIG. 43(a) is a plan view illustrating the method for producing a semiconductor device according to the embodiment;

FIG. 43(b) is a cross-sectional view taken along line X-X' of FIG. 43(a);

FIG. 43(c) is a cross-sectional view taken along line Y-Y' of FIG. 43(a);

FIG. 44(a) is a plan view illustrating the method for producing a semiconductor device according to the embodiment;

FIG. 44(b) is a cross-sectional view taken along line X-X' of FIG. 44(a);

FIG. 44(c) is a cross-sectional view taken along line Y-Y' of FIG. 44(a);

FIG. 45(a) is a plan view illustrating the method for producing a semiconductor device according to the embodiment;

FIG. 45(b) is a cross-sectional view taken along line X-X' of FIG. 45(a);

FIG. 45(c) is a cross-sectional view taken along line Y-Y' of FIG. 45(a);

FIG. 46(a) is a plan view illustrating the method for producing a semiconductor device according to the embodiment;

FIG. 46(b) is a cross-sectional view taken along line X-X' of FIG. 46(a);

FIG. 46(c) is a cross-sectional view taken along line Y-Y' of FIG. 46(a);

FIG. 47(a) is a plan view illustrating the method for producing a semiconductor device according to the embodiment;

FIG. 47(b) is a cross-sectional view taken along line X-X' of FIG. 47(a);

FIG. 47(c) is a cross-sectional view taken along line Y-Y' of FIG. 47(a);

FIG. 48(a) is a plan view illustrating the method for producing a semiconductor device according to the embodiment;

FIG. 48(b) is a cross-sectional view taken along line X-X' of FIG. 48(a); and

FIG. 48(c) is a cross-sectional view taken along line Y-Y' of FIG. 48(a).

DETAILED DESCRIPTION OF THE INVENTION

Steps of producing a semiconductor device having a structure of an SGT according to an embodiment of the present invention will now be described with reference to FIGS. 2 to 48.

(First Step)

A first step of forming a planar silicon layer 107 on a silicon substrate 101 and forming a first pillar-shaped silicon layer 105 and a second pillar-shaped silicon layer 104 on the planar silicon layer 107 will now be described.

Figure 2:
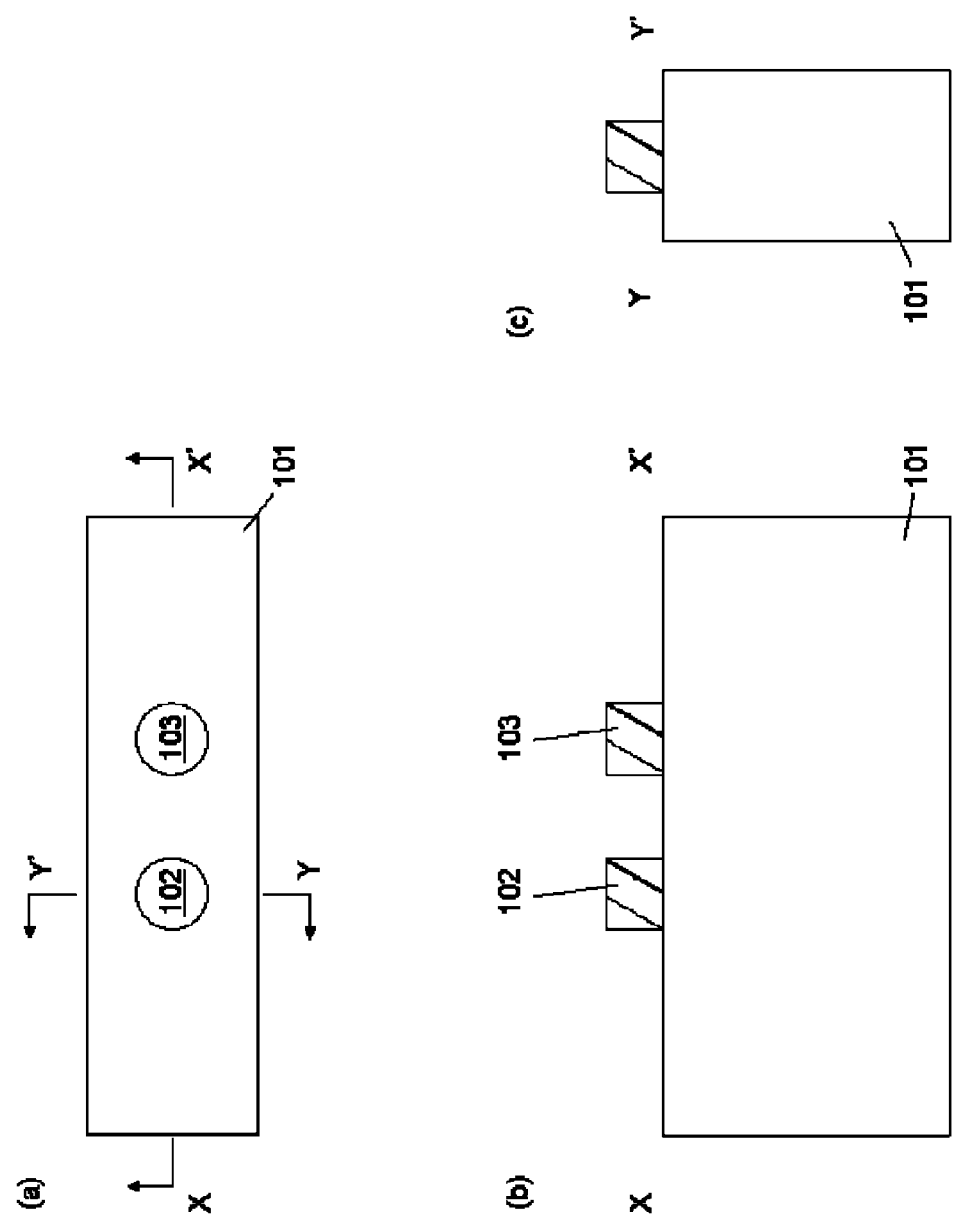
FIG. 2(a) is a plan view illustrating a method for producing a semiconductor device according to the embodiment.
FIG. 2(b) is a cross-sectional view taken along line X-X' of FIG. 2(a)
FIG. 2(c) is a cross-sectional view taken along line Y-Y' of FIG. 2(a)

First, as illustrated in FIG. 2, first resists 102 and 103 used for forming a first pillar-shaped silicon layer 105 and a second pillar-shaped silicon layer 104 on a silicon substrate 101 are formed.

Figure 3:
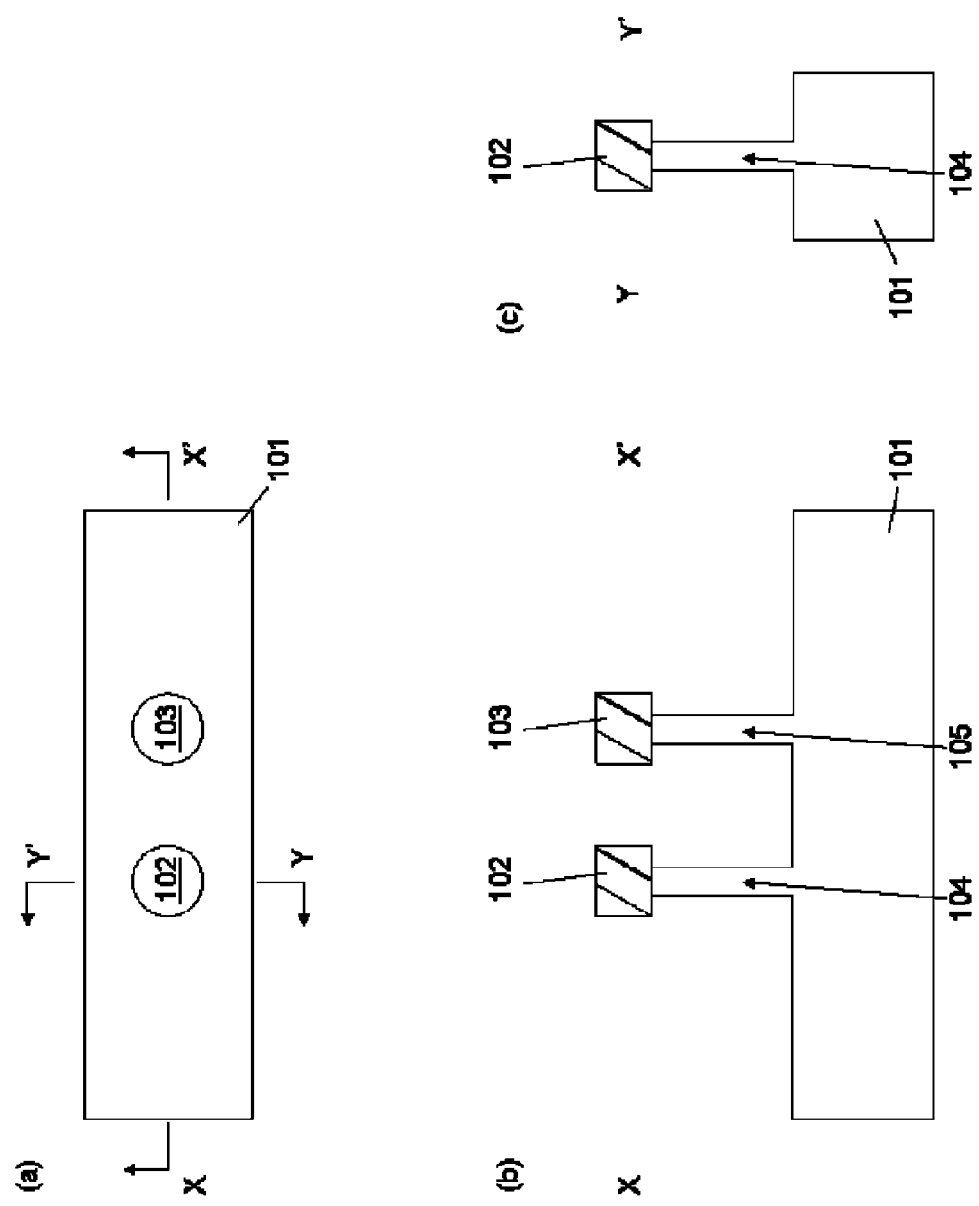
FIG. 3(a) is a plan view illustrating the method for producing a semiconductor device according to the embodiment.
FIG. 3(b) is a cross-sectional view taken along line X-X' of FIG. 3(a)
FIG. 3(c) is a cross-sectional view taken along line Y-Y' of FIG. 3(a)

Next, as illustrated in FIG. 3, the silicon substrate 101 is etched to form the first pillar-shaped silicon layer 105 and the second pillar-shaped silicon layer 104.

Figure 4:
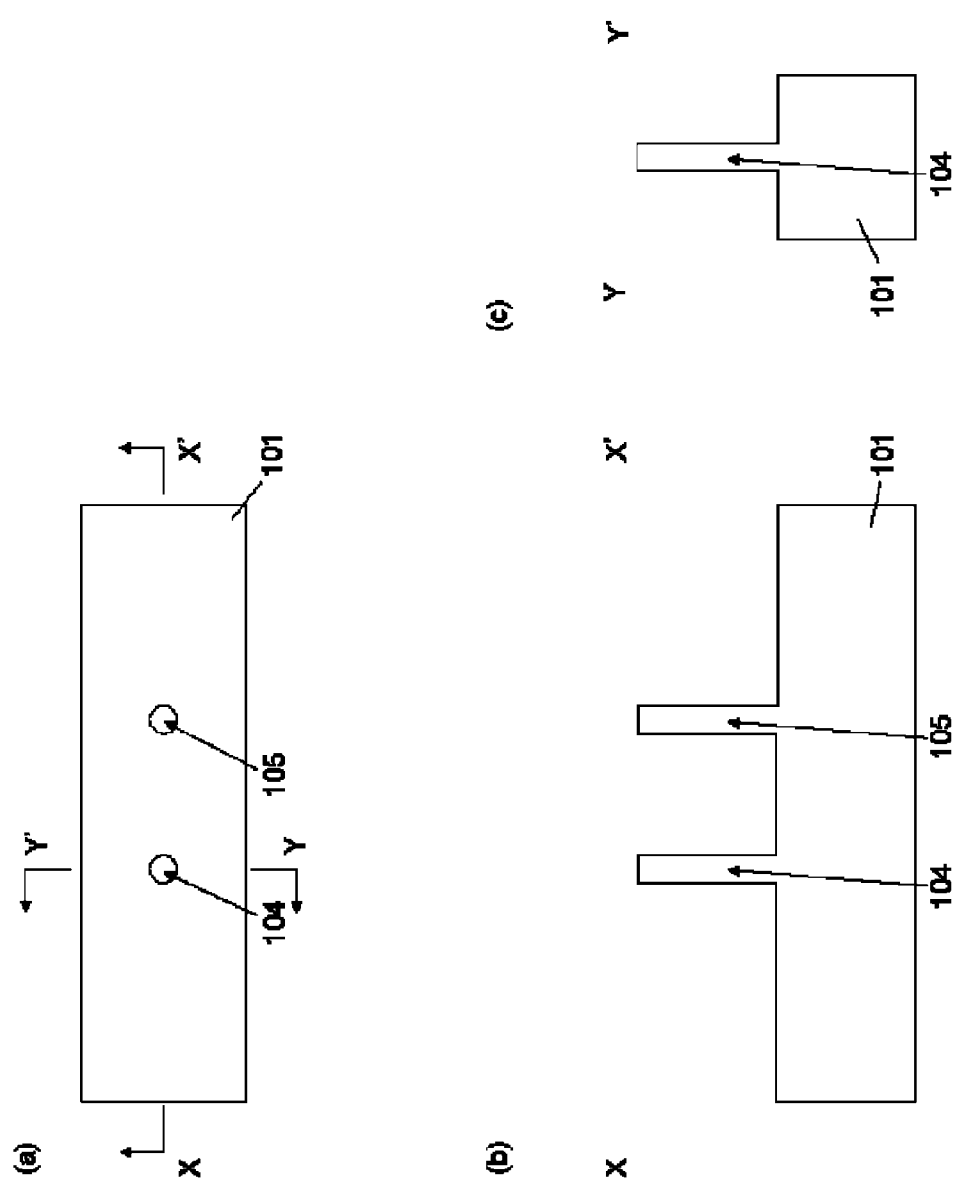
FIG. 4(a) is a plan view illustrating the method for producing a semiconductor device according to the embodiment.
FIG. 4(b) is a cross-sectional view taken along line X-X' of FIG. 4(a)
FIG. 4(c) is a cross-sectional view taken along line Y-Y' of FIG. 4(a)

Subsequently, as illustrated in FIG. 4, the first resists 102 and 103 are removed.

Figure 5:
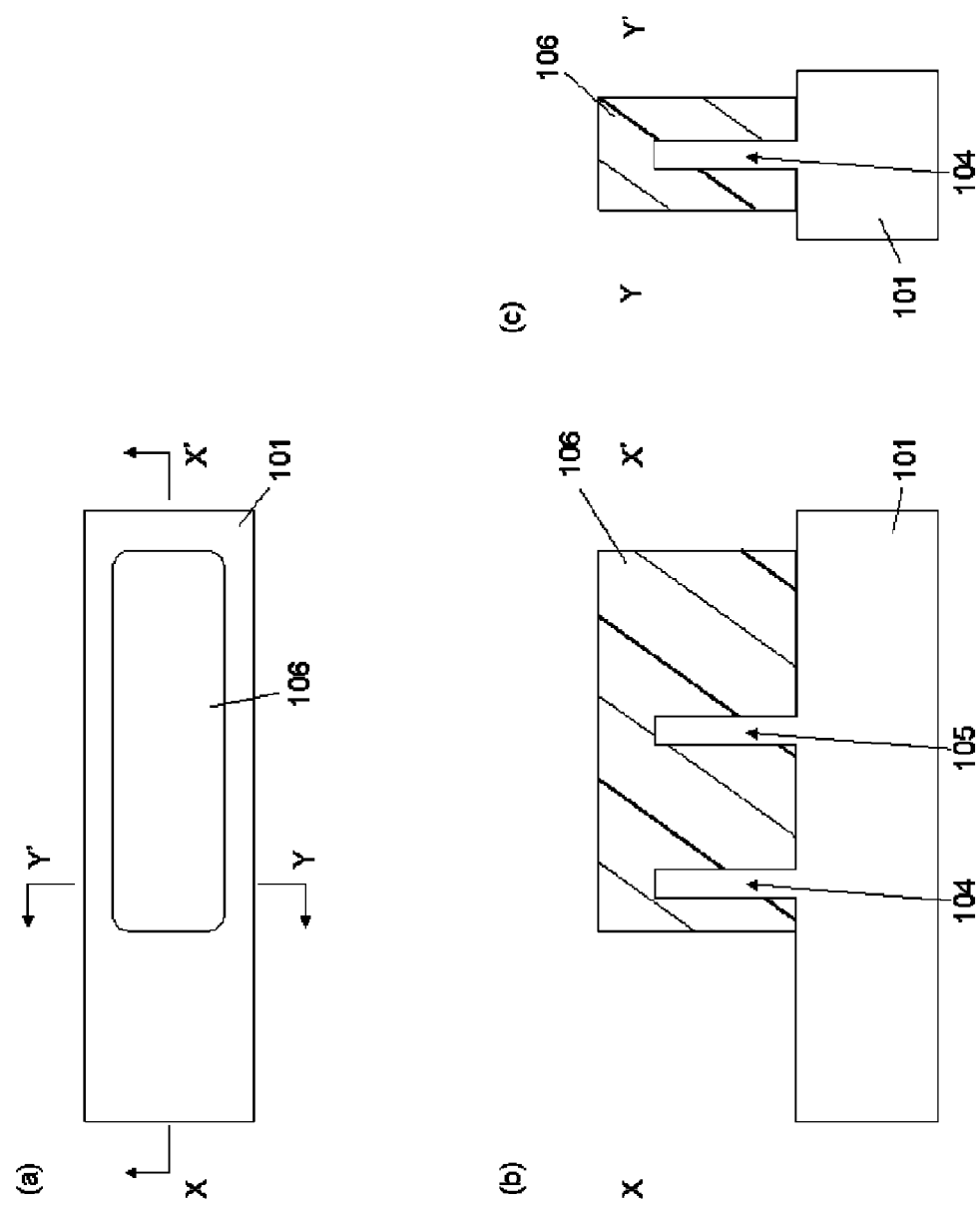
FIG. 5(a) is a plan view illustrating the method for producing a semiconductor device according to the embodiment.
FIG. 5(b) is a cross-sectional view taken along line X-X' of FIG. 5(a)
FIG. 5(c) is a cross-sectional view taken along line Y-Y' of FIG. 5(a)

Subsequently, as illustrated in FIG. 5, a second resist 106 used for forming a planar silicon layer 107 is formed.

Subsequently, as illustrated in FIG. 6, the silicon substrate 101 is etched to form the planar silicon layer 107.

Figure 7:
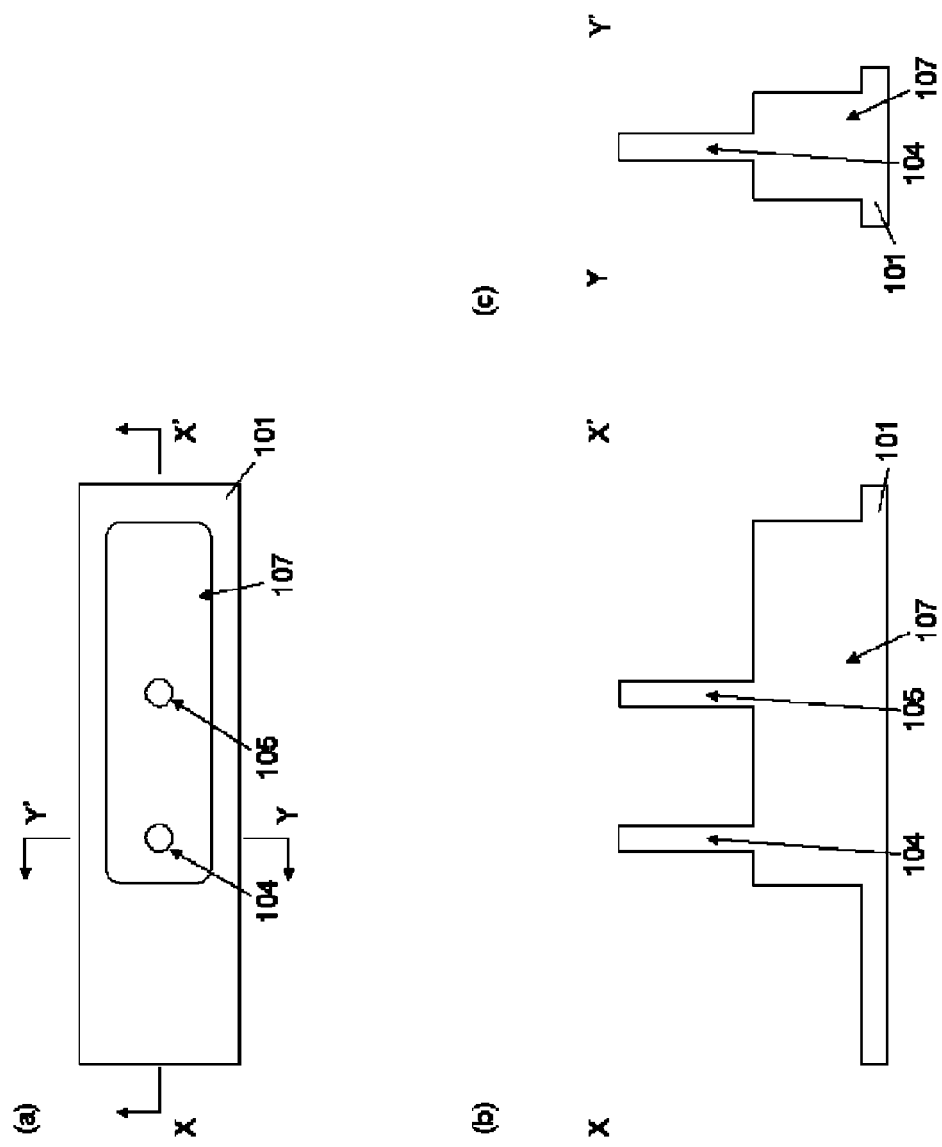
FIG. 7(a) is a plan view illustrating the method for producing a semiconductor device according to the embodiment.
FIG. 7(b) is a cross-sectional view taken along line X-X' of FIG. 7(a)
FIG. 7(c) is a cross-sectional view taken along line Y-Y' of FIG. 7(a)

Subsequently, as illustrated in FIG. 7, the second resist 106 is removed.

As described above, the first step of forming the planar silicon layer 107 on the silicon substrate 101 and forming the first pillar-shaped silicon layer 105 and the second pillar-shaped silicon layer 104 on the planar silicon layer 107 is conducted.

Figure 8:
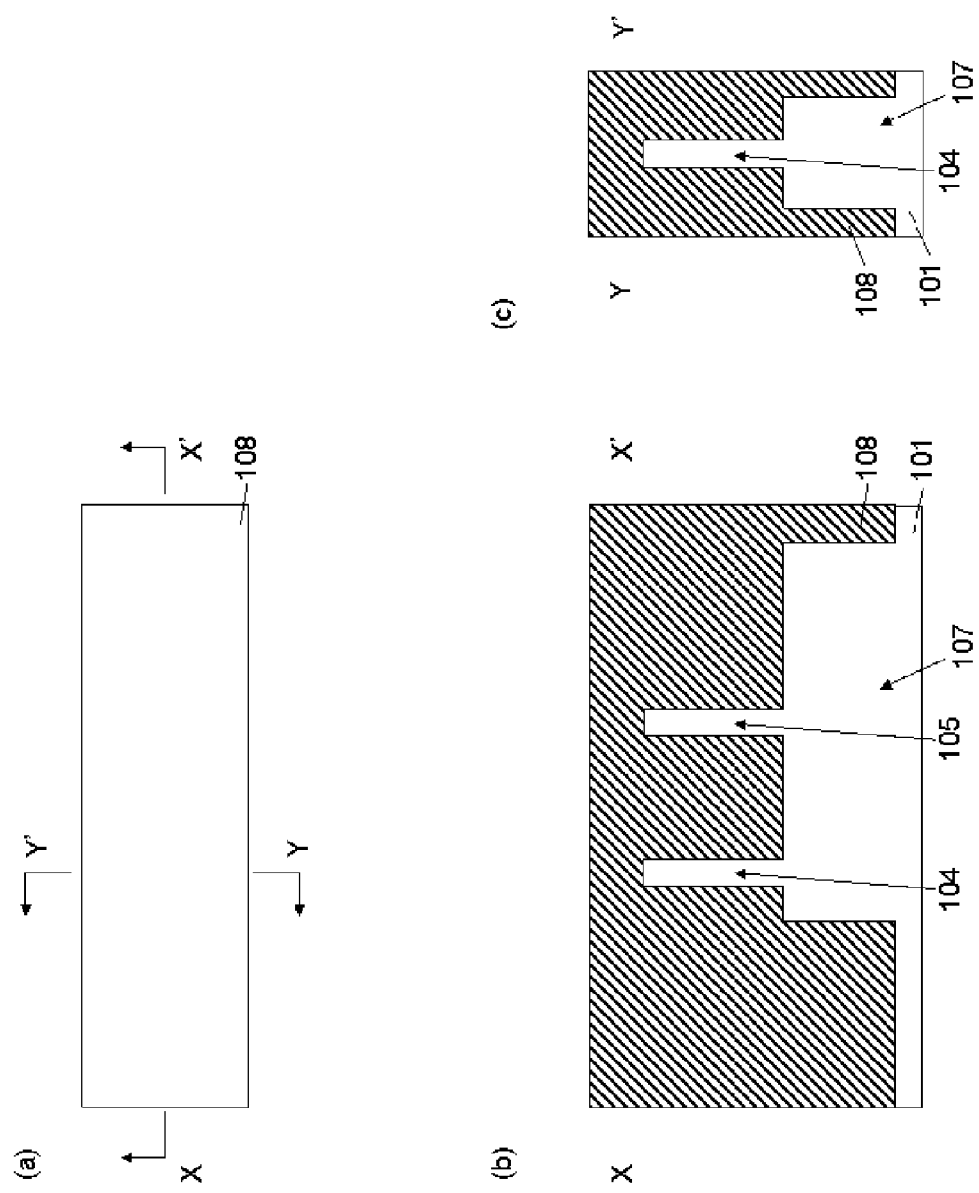
FIG. 8(a) is a plan view illustrating the method for producing a semiconductor device according to the embodiment.
FIG. 8(b) is a cross-sectional view taken along line X-X' of FIG. 8(a)
FIG. 8(c) is a cross-sectional view taken along line Y-Y' of FIG. 8(a)

Next, as illustrated in FIG. 8, a first oxide film 108 is deposited, and the surface thereof is planarized.

Figure 9:
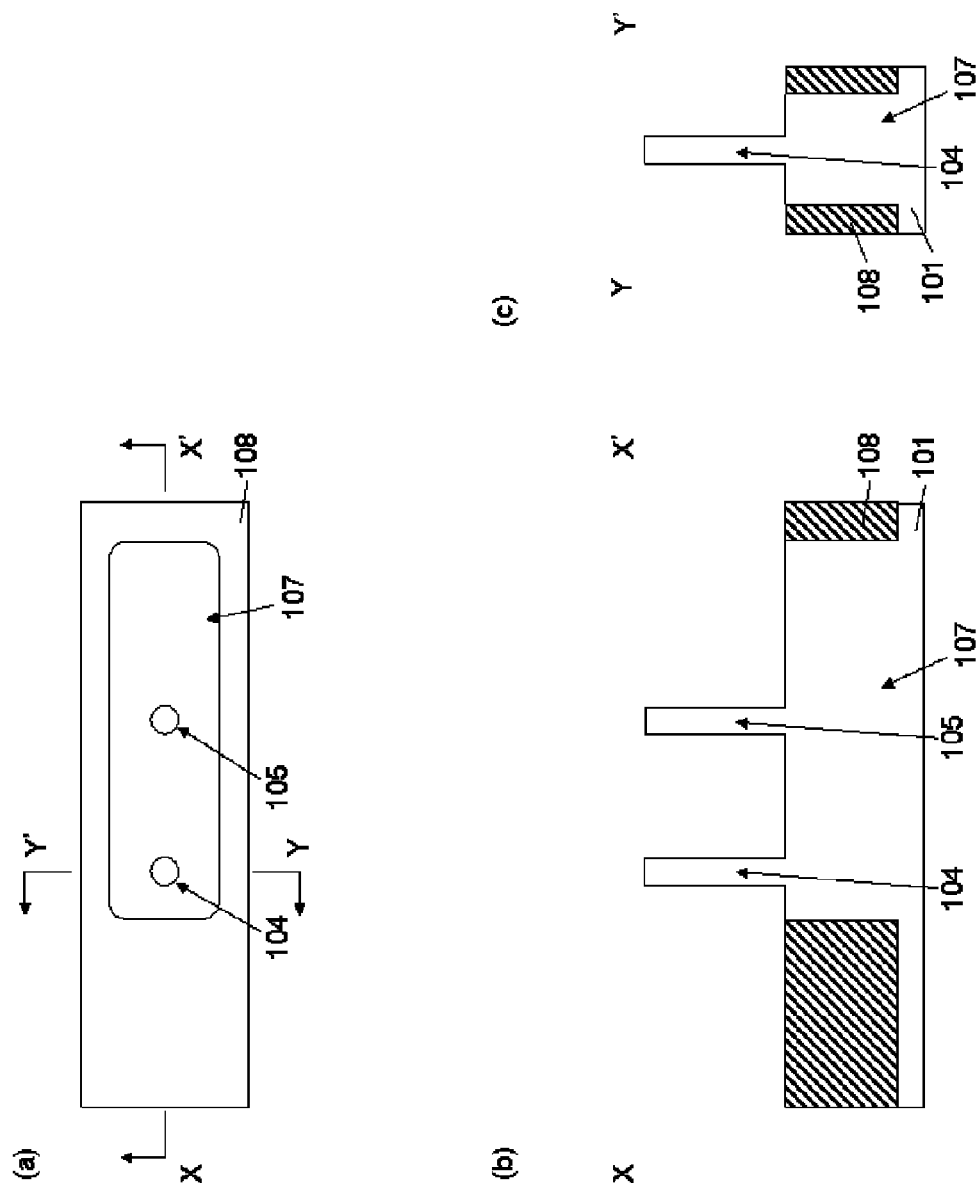
FIG. 9(a) is a plan view illustrating the method for producing a semiconductor device according to the embodiment.
FIG. 9(b) is a cross-sectional view taken along line X-X' of FIG. 9(a)
FIG. 9(c) is a cross-sectional view taken along line Y-Y' of FIG. 9(a)

Subsequently, as illustrated in FIG. 9, the first oxide film 108 is etched to be left around the planar silicon layer 107.

(Second Step)

Next, a second step will now be described. Specifically, as illustrated in FIG. 10, a gate insulating film 109 is formed around the first pillar-shaped silicon layer 105 and the second pillar-shaped silicon layer 104. A metal film 110 and a polysilicon 111 are deposited around the gate insulating film 109, and the surface of the polysilicon 111 is planarized and etching is conducted, thereby exposing upper portions of the first pillar-shaped silicon layer 105 and the second pillar-shaped silicon layer 104. Subsequently, a first insulating film sidewall 201 is formed on an upper side wall of the first pillar-shaped silicon layer 105, and a second insulating film sidewall 200 is formed on an upper side wall of the second pillar-shaped silicon layer 104. A first gate electrode 117b and a second gate electrode 117a each having a laminated structure of the metal film 110 and the polysilicon 111 are formed around the gate insulating film 109. Subsequently, a gate line 117c connected to the first gate electrode 117b and the second gate electrode 117a is formed.

First, as illustrated in FIG. 10, a gate insulating film 109 is formed around the first pillar-shaped silicon layer 105 and the second pillar-shaped silicon layer 104. As for the material of the gate insulating film 109, an oxide film, a laminated structure of an oxide film and a nitride film, a nitride film, or a high dielectric film can be used.

Next, as illustrated in FIG. 11, a metal film 110 is formed around the gate insulating film 109.

A metal material that can be used as a gate electrode, such as titanium, titanium nitride, tantalum, or tantalum nitride, can be used as the metal film 110.

Subsequently, as illustrated in FIG. 12, a polysilicon 111 is deposited and the surface thereof is planarized.

Subsequently, as illustrated in FIG. 13, the polysilicon 111 is etched.

Subsequently, as illustrated in FIG. 14, the polysilicon 111 is etched to expose the metal film 110.

Subsequently, as illustrated in FIG. 15, the polysilicon 111 is etched to expose upper portions of the first pillar-shaped silicon layer 105 and the second pillar-shaped silicon layer 104.

Subsequently, as illustrated in FIG. 16, the metal film 110 is etched. In this step, wet etching is preferably used.

Subsequently, as illustrated in FIG. 17, a second oxide film 112 and a first nitride film 113 are deposited.

Subsequently, as illustrated in FIG. 18, the first nitride film 113 is etched to remain in a sidewall shape on the side walls of the two pillars. Thus, nitride film sidewalls 114 and 115 are formed. The second oxide film 112 and the nitride film sidewall 115 form a first insulating film sidewall 201. The second oxide film 112 and the nitride film sidewall 114 form a second insulating film sidewall 200.

Figure 19:
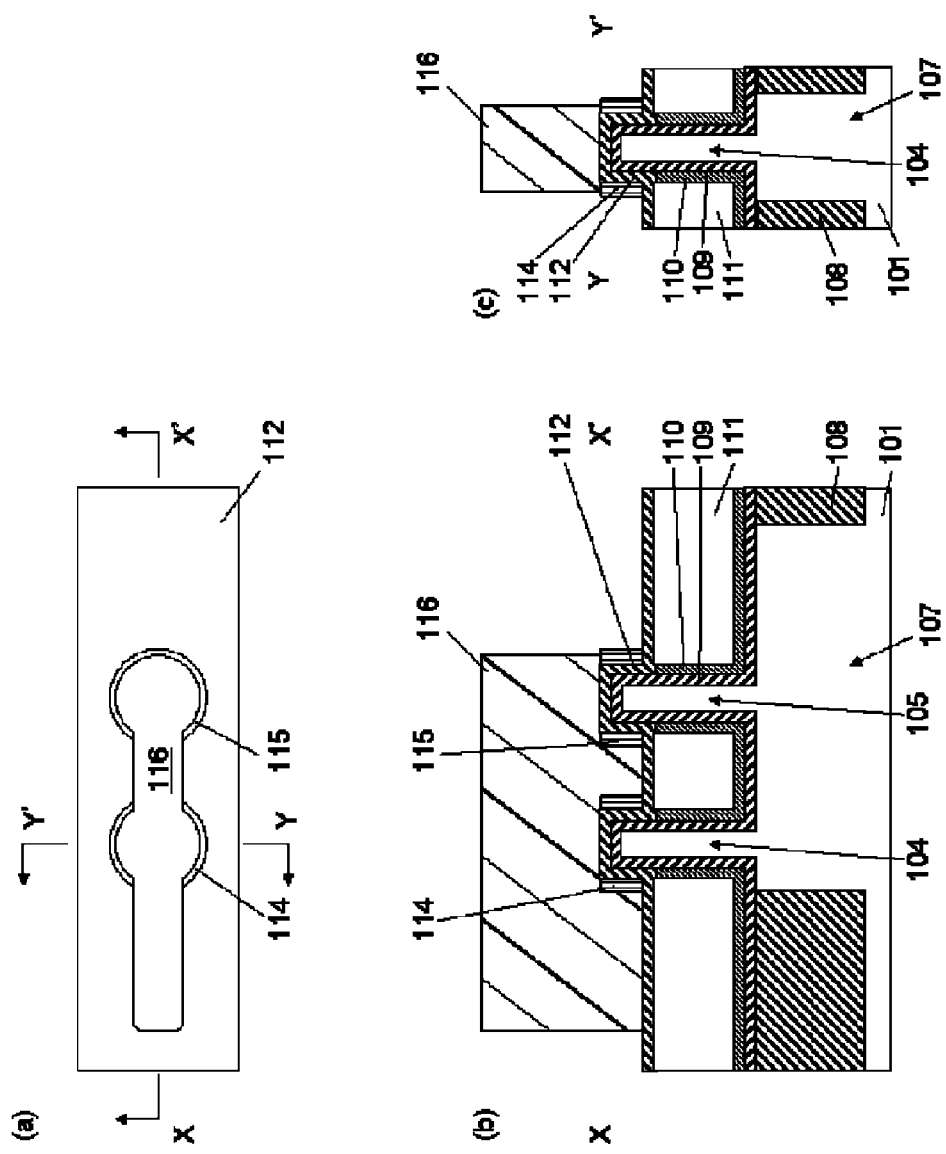
FIG. 19(a) is a plan view illustrating the method for producing a semiconductor device according to the embodiment.
FIG. 19(b) is a cross-sectional view taken along line X-X' of FIG. 19(a)
FIG. 19(c) is a cross-sectional view taken along line Y-Y' of FIG. 19(a)

Subsequently, as illustrated in FIG. 19, in order to form a first gate electrode 117b, a second gate electrode 117a, and a gate line 117c, a third resist 116 is formed so as to cover an upper portion of the first pillar-shaped silicon layer 105 and an upper portion of the second pillar-shaped silicon layer 104. At this time, since the upper portion of the first pillar-shaped silicon layer 105 and the upper portion of the second pillar-shaped silicon layer 104 are covered with the third resist 116, it is possible to prevent the gate insulating film 109 from being etched during etching and thus to prevent the pillar-shaped silicon layers from being etched.

Figure 20:
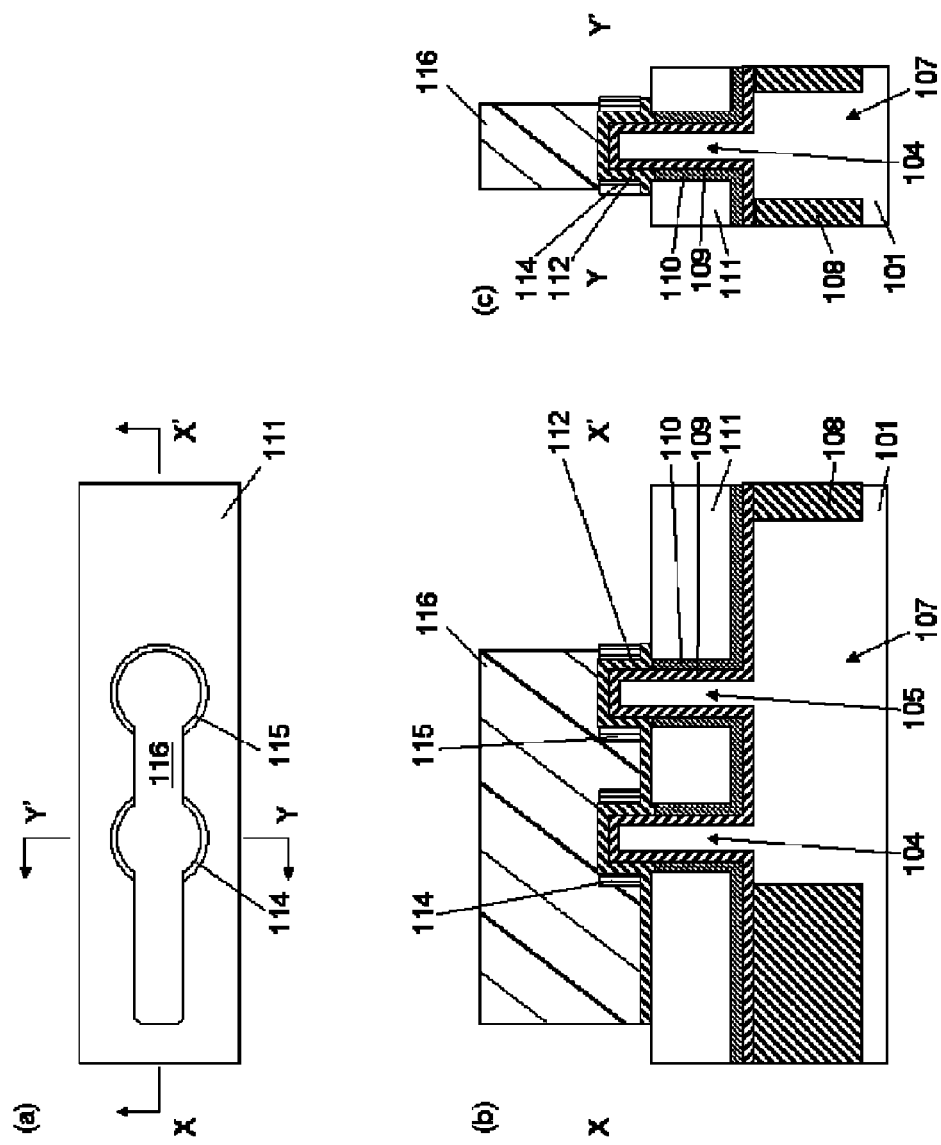
FIG. 20(a) is a plan view illustrating the method for producing a semiconductor device according to the embodiment.
FIG. 20(b) is a cross-sectional view taken along line X-X' of FIG. 20(a)
FIG. 20(c) is a cross-sectional view taken along line Y-Y' of FIG. 20(a)

Subsequently, as illustrated in FIG. 20, the second oxide film 112 is etched.

Figure 21:
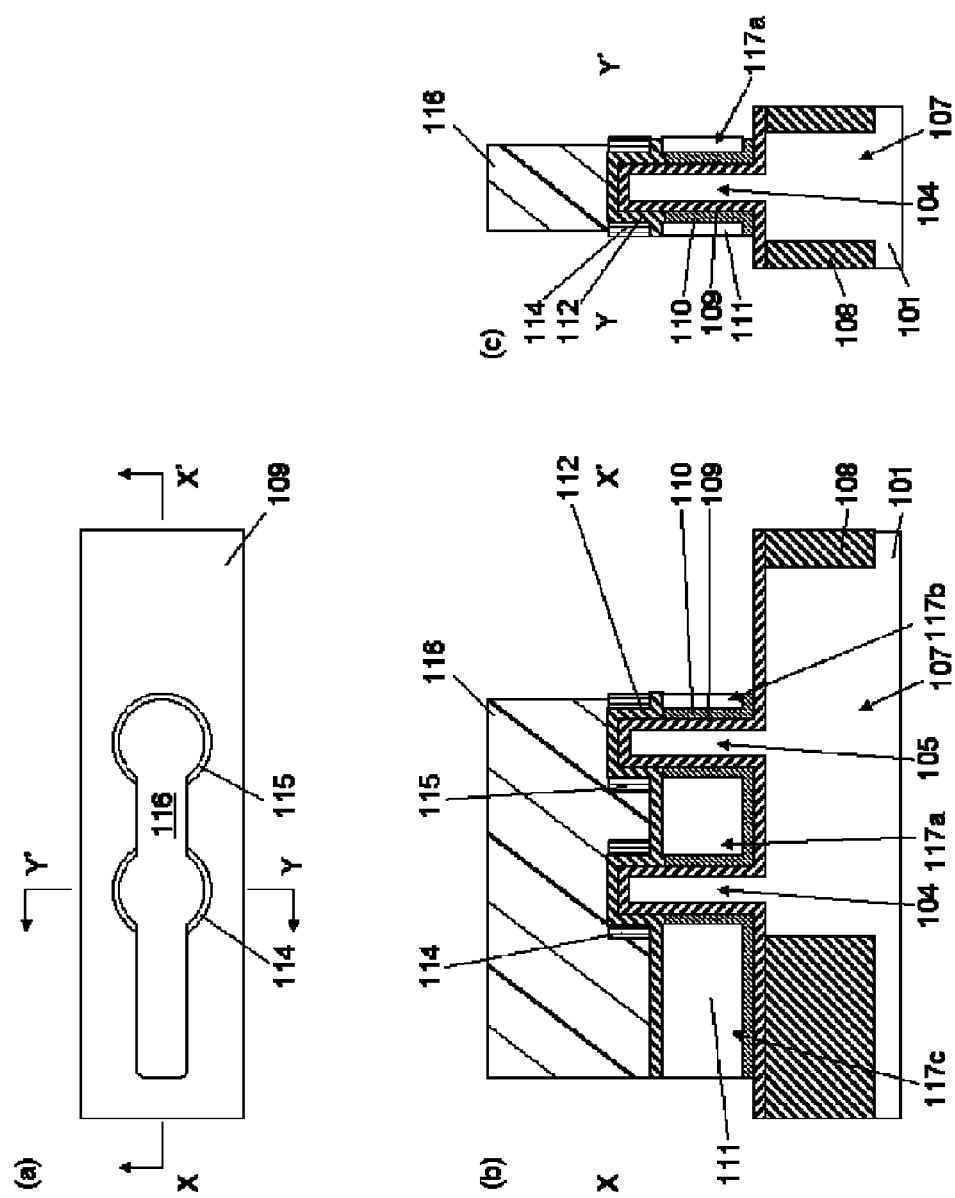
FIG. 21(a) is a plan view illustrating the method for producing a semiconductor device according to the embodiment.
FIG. 21(b) is a cross-sectional view taken along line X-X' of FIG. 21(a)
FIG. 21(c) is a cross-sectional view taken along line Y-Y' of FIG. 21(a)

Subsequently, as illustrated in FIG. 21, the polysilicon 111 is etched and the metal film 110 is etched to form the first gate electrode 117b, the second gate electrode 117a, and the gate line 117c.

Figure 22:
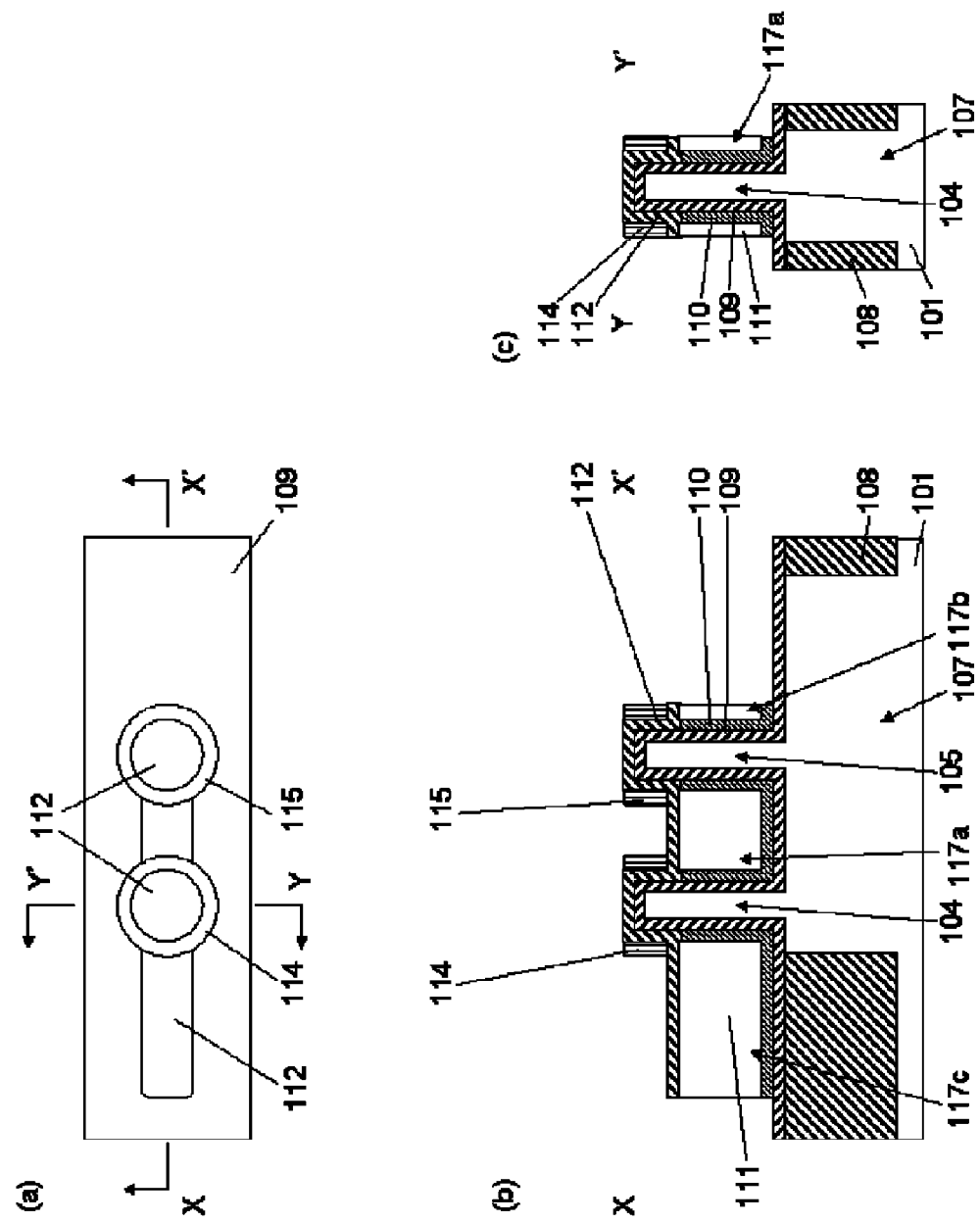
FIG. 22(a) is a plan view illustrating the method for producing a semiconductor device according to the embodiment.
FIG. 22(b) is a cross-sectional view taken along line X-X' of FIG. 22(a)
FIG. 22(c) is a cross-sectional view taken along line Y-Y' of FIG. 22(a)

Subsequently, as illustrated in FIG. 22, the third resist 116 is removed.

Subsequently, as illustrated in FIG. 23, wet etching is conducted in order to remove residue of the metal film 110. This process may be omitted when residue of the metal film 110 is not present.

As described above, the second step is conducted. Specifically, a gate insulating film 109 is formed around the first pillar-shaped silicon layer 105 and the second pillar-shaped silicon layer 104. A metal film 110 and a polysilicon 111 are deposited around the gate insulating film 109, and the surface of the polysilicon 111 is planarized and etching is further conducted, thereby exposing upper portions of the first pillar-shaped silicon layer 105 and the second pillar-shaped silicon layer 104. Subsequently, a first insulating film sidewall 201 is formed on an upper side wall of the first pillar-shaped silicon layer 105, and a second insulating film sidewall 200 is formed on an upper side wall of the second pillar-shaped silicon layer 104. A first gate electrode 117b and a second gate electrode 117a each having a laminated structure of the metal film 110 and the polysilicon 111 are formed around the gate insulating film 109. Subsequently, a gate line 117c connected to the first gate electrode 117b and the second gate electrode 117a is formed.

(Third Step)

Next, a third step will be described. Specifically, a first n-type diffusion layer 119 is formed in an upper portion of the first pillar-shaped silicon layer 105, and a second n-type diffusion layer 120 is formed in a lower portion of the first pillar-shaped silicon layer 105 and an upper portion of the planar silicon layer 107. Subsequently, a first p-type diffusion layer 125 is formed in an upper portion of the second pillar-shaped silicon layer 104, and a second p-type diffusion layer 126 is formed in a lower portion of the second pillar-shaped silicon layer 104 and an upper portion of the planar silicon layer 107.

Figure 24:
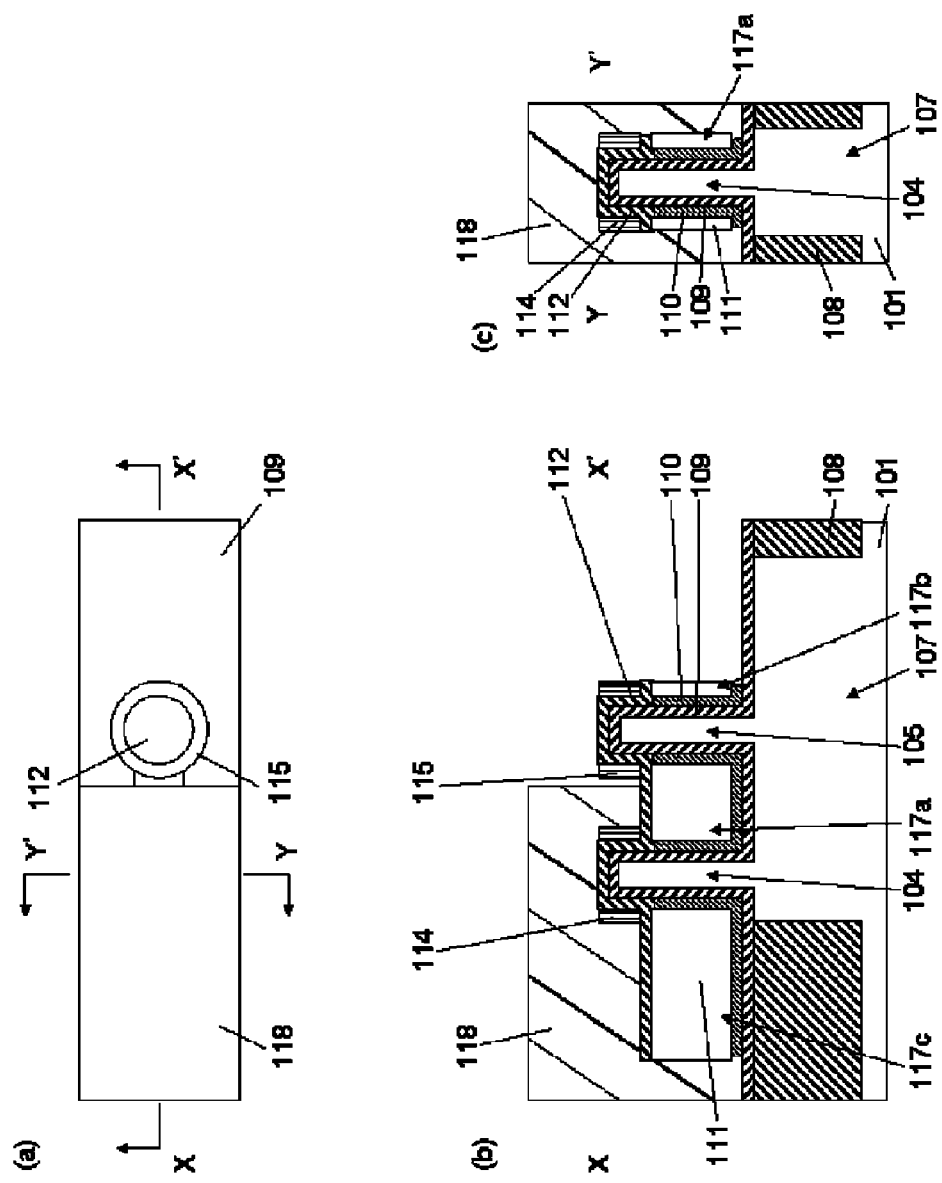
FIG. 24(a) is a plan view illustrating the method for producing a semiconductor device according to the embodiment.
FIG. 24(b) is a cross-sectional view taken along line X-X' of FIG. 24(a)
FIG. 24(c) is a cross-sectional view taken along line Y-Y' of FIG. 24(a)

First, as illustrated in FIG. 24, a fourth resist 118 for forming a first n-type diffusion layer 119 and a second n-type diffusion layer 120 is formed.

Figure 25:
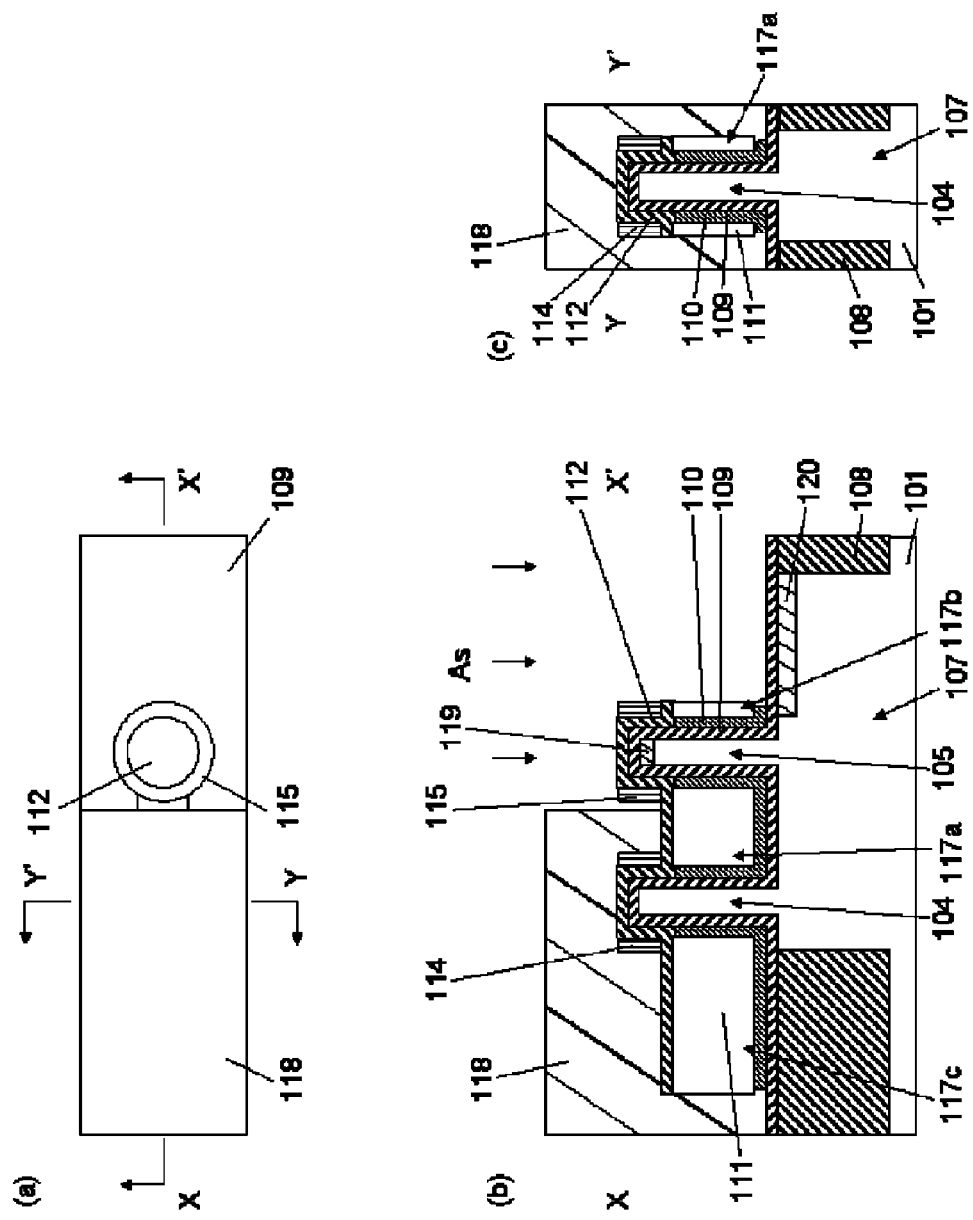
FIG. 25(a) is a plan view illustrating the method for producing a semiconductor device according to the embodiment.
FIG. 25(b) is a cross-sectional view taken along line X-X' of FIG. 25(a)
FIG. 25(c) is a cross-sectional view taken along line Y-Y' of FIG. 25(a)

Next, as illustrated in FIG. 25, arsenic is implanted to form the first n-type diffusion layer 119 and the second n-type diffusion layer 120. In this step, phosphorus may be implanted instead of arsenic.

Figure 26:
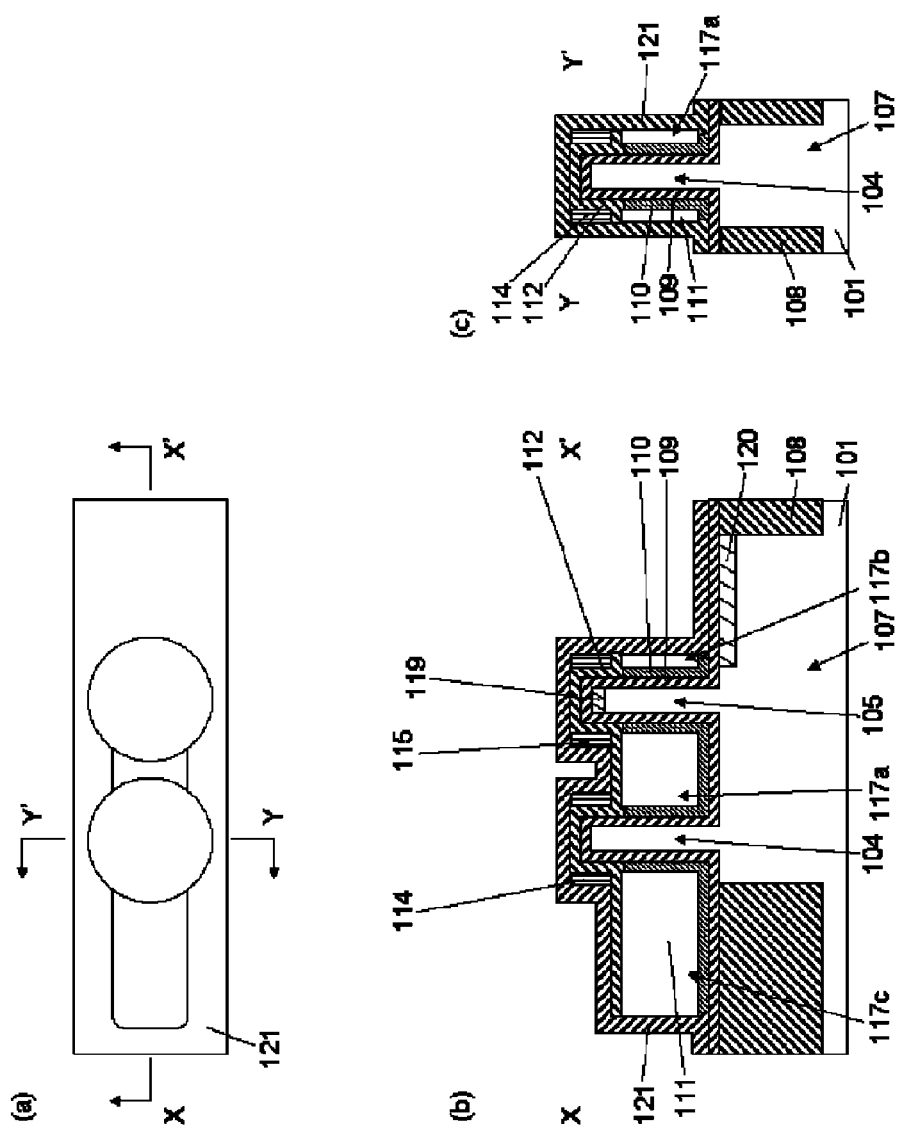
FIG. 26(a) is a plan view illustrating the method for producing a semiconductor device according to the embodiment.
FIG. 26(b) is a cross-sectional view taken along line X-X' of FIG. 26(a)
FIG. 26(c) is a cross-sectional view taken along line Y-Y' of FIG. 26(a)

Subsequently, as illustrated in FIG. 26, the fourth resist 118 is removed, and a third oxide film 121 is deposited.

Figure 27:
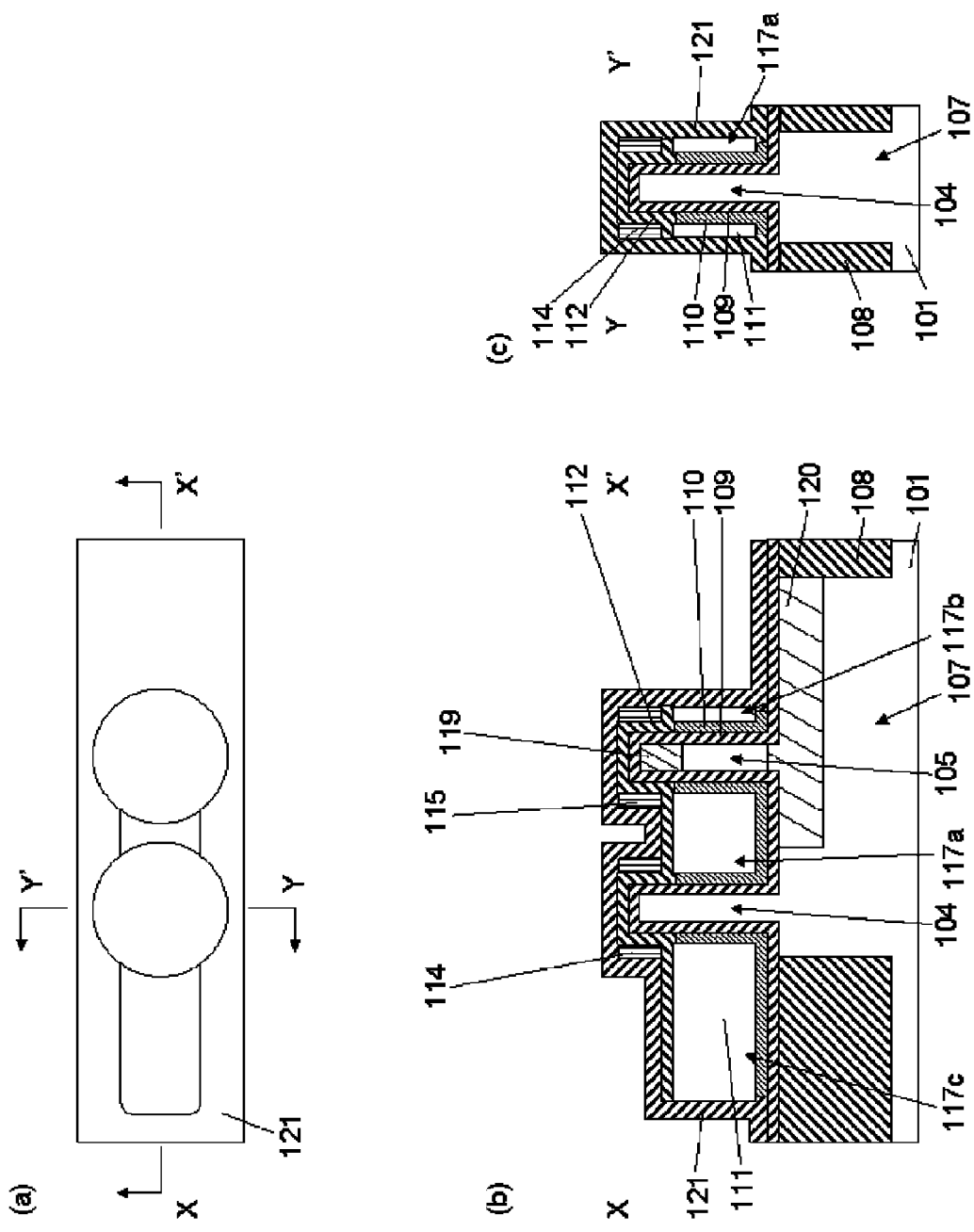
FIG. 27(a) is a plan view illustrating the method for producing a semiconductor device according to the embodiment.
FIG. 27(b) is a cross-sectional view taken along line X-X' of FIG. 27(a)
FIG. 27(c) is a cross-sectional view taken along line Y-Y' of FIG. 27(a)

Subsequently, heat treatment is conducted with reference to FIG. 27. In this step, it is preferable to conduct heat treatment that is optimized for an NMOS SGT.

Subsequently, as illustrated in FIG. 28, the third oxide film 121 is removed, and the second oxide film 112 and the gate insulating film 109 are etched. In this step, the second oxide film 112 is etched such that the second oxide film 112 remains around the first pillar-shaped silicon layer 105 to function as an oxide film sidewall 123. Similarly, the second oxide film 112 is etched such that the second oxide film 112 remains around the second pillar-shaped silicon layer 104 to function as an oxide film sidewall 122. Accordingly, the oxide film sidewall 123 and the nitride film sidewall 115 function as the first insulating film sidewall 201, and the oxide film sidewall 122 and the nitride film sidewall 114 function as the second insulating film sidewall 200.

Figure 29:
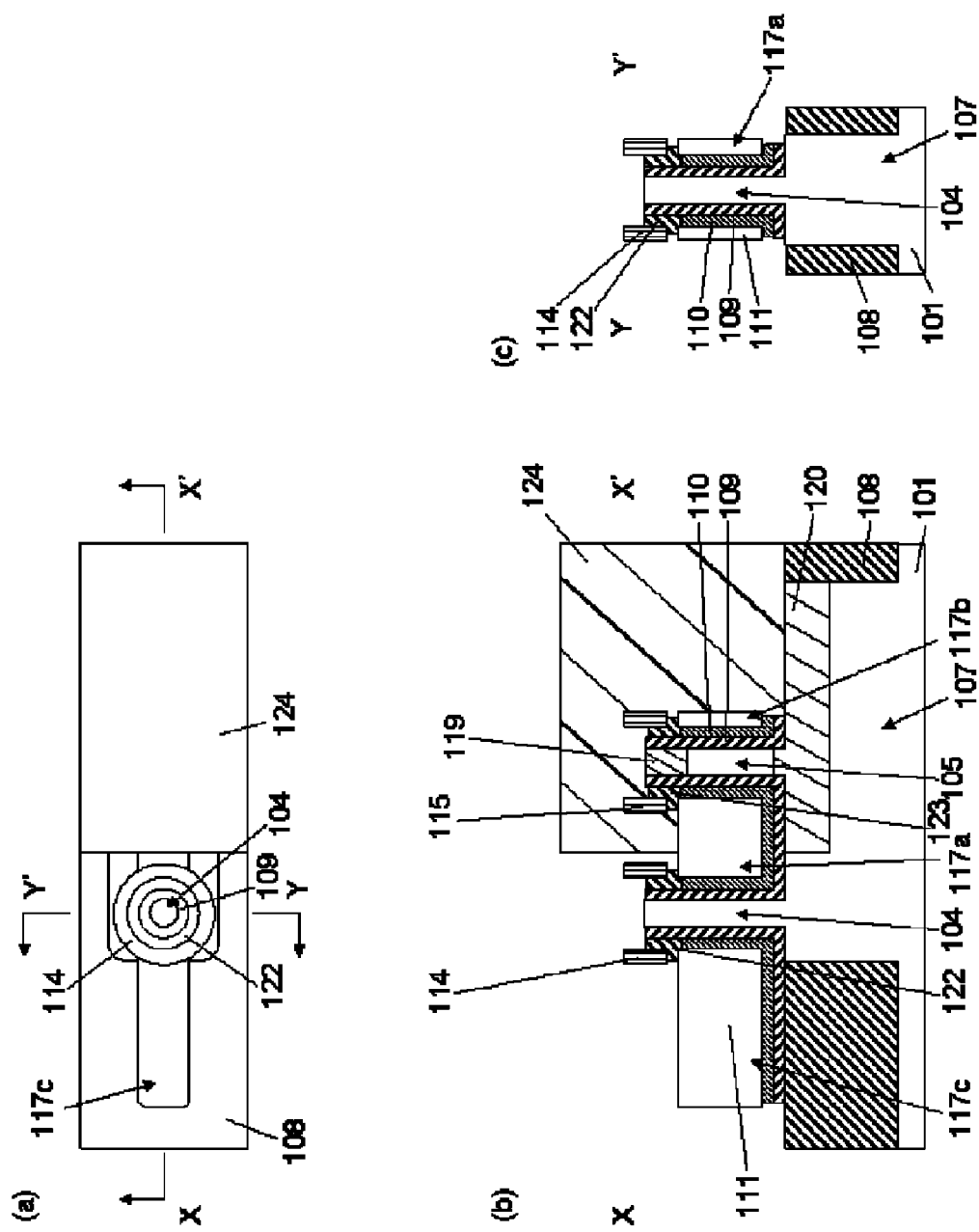
FIG. 29(a) is a plan view illustrating the method for producing a semiconductor device according to the embodiment.
FIG. 29(b) is a cross-sectional view taken along line X-X' of FIG. 29(a)
FIG. 29(c) is a cross-sectional view taken along line Y-Y' of FIG. 29(a)

Subsequently, as illustrated in FIG. 29, a fifth resist 124 for forming a first p-type diffusion layer 125 and a second p-type diffusion layer 126 is formed.

Figure 30:
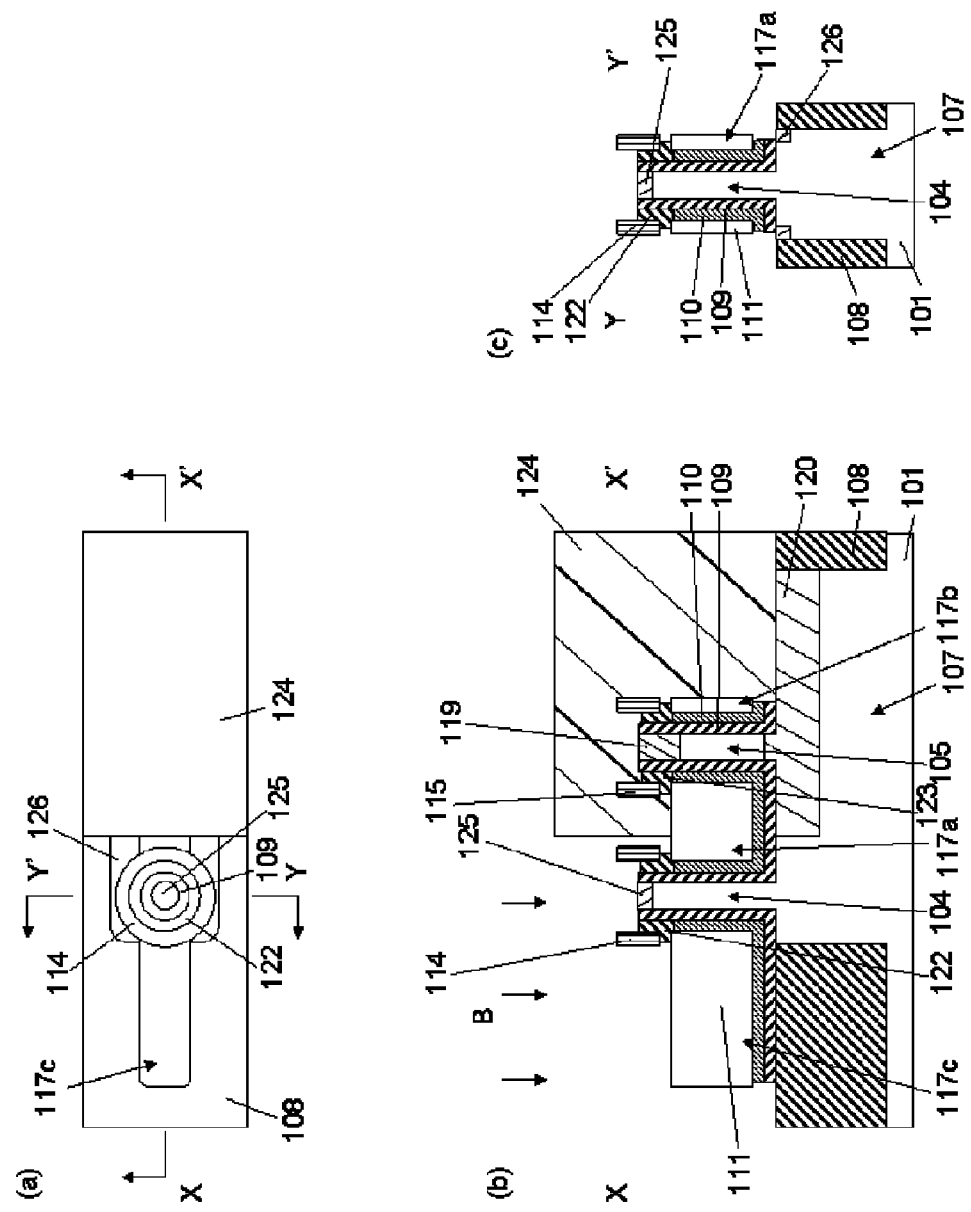
FIG. 30(a) is a plan view illustrating the method for producing a semiconductor device according to the embodiment.
FIG. 30(b) is a cross-sectional view taken along line X-X' of FIG. 30(a)
FIG. 30(c) is a cross-sectional view taken along line Y-Y' of FIG. 30(a)

Next, as illustrated in FIG. 30, boron is implanted to form the first p-type diffusion layer 125 and the second p-type diffusion layer 126.

Next, as illustrated in FIG. 31, the fifth resist 124 is removed.

Figure 32:
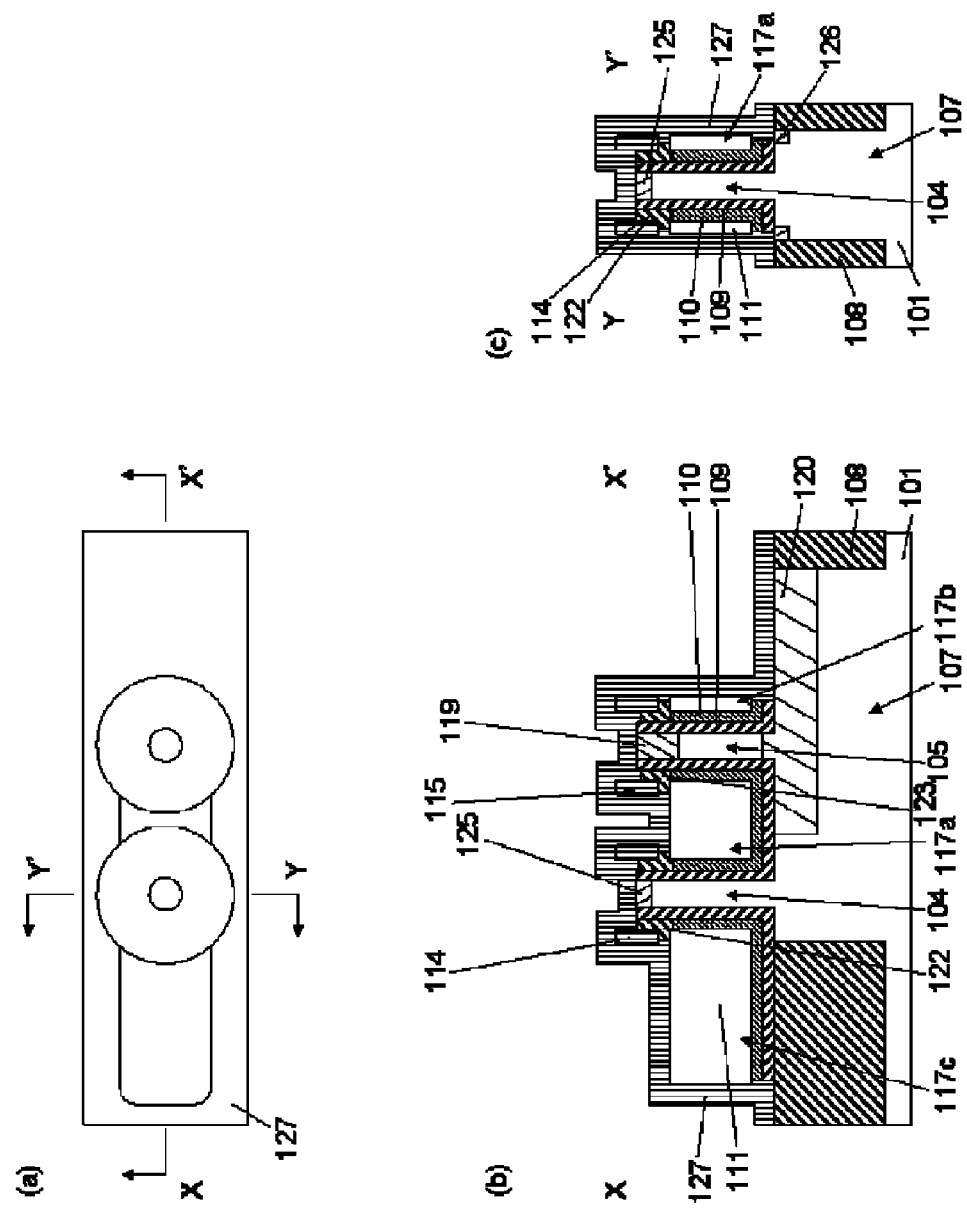
FIG. 32(a) is a plan view illustrating the method for producing a semiconductor device according to the embodiment.
FIG. 32(b) is a cross-sectional view taken along line X-X' of FIG. 32(a)
FIG. 32(c) is a cross-sectional view taken along line Y-Y' of FIG. 32(a)

Subsequently, as illustrated in FIG. 32, a second nitride film 127 is deposited.

Subsequently, heat treatment is conducted with reference to FIG. 33. In this step, it is preferable to conduct heat treatment that is optimized for a PMOS SGT.

As described above, the third step has been conducted. Specifically, a first n-type diffusion layer 119 is formed in an upper portion of the first pillar-shaped silicon layer 105, and a second n-type diffusion layer 120 is formed in a lower portion of the first pillar-shaped silicon layer 105 and an upper portion of the planar silicon layer 107. Subsequently, a first p-type diffusion layer 125 is formed in an upper portion of the second pillar-shaped silicon layer 104, and a second p-type diffusion layer 126 is formed in a lower portion of the second pillar-shaped silicon layer 104 and an upper portion of the planar silicon layer 107.

In the above embodiment, after the gate electrodes are formed, the first n-type diffusion layer, the second n-type diffusion layer, the first p-type diffusion layer, and the second p-type diffusion layer are formed. However, the embodiment is not limited thereto. Alternatively, after pillar-shaped silicon layers and a planar silicon layer are formed and side walls are then formed on side walls of the pillar-shaped silicon layers, a first n-type diffusion layer and a second n-type diffusion layer may be formed, a first p-type diffusion layer and a second p-type diffusion layer may then be formed, and gate electrodes may then be formed.

(Fourth Step)

Next, a fourth step of forming a third insulating film sidewall 202 on a side wall of the first insulating film sidewall 201, a side wall of the second insulating film sidewall 200, a side wall of the first gate electrode 117b, a side wall of the second gate electrode 117a, and a side wall of the gate line 117c will be described.

First, as illustrated in FIG. 34, the second nitride film 127 is etched to remain in a sidewall shape. Thus, nitride film sidewalls 128, 129, and 130 are formed. Here, the nitride film sidewall 128 functions as a third insulating film sidewall 202.

In this structure, an upper portion of the first gate electrode 117b is covered with the first insulating film sidewall 201 and the side wall of the first gate electrode 117b is coveted with the third insulating film sidewall 202. In addition, the side wall of the first insulating film sidewall 201 is covered with the third insulating film sidewall 202. Accordingly, if the position of a contact formed on a diffusion layer in an upper portion of the planar silicon layer is shifted to the first gate electrode side, a short-circuit between the first gate electrode and the contact is prevented.

Similarly, an upper portion of the second gate electrode 117a is covered with the second insulating film sidewall 200, and the side wall of the second gate electrode 117a is covered with the third insulating film sidewall 202. In addition, the side wall of the second insulating film sidewall 200 is covered with the third insulating film sidewall 202. Accordingly, in the case where a contact formed on a diffusion layer in an upper portion of the planar silicon layer is formed in the vicinity of the second gate electrode 117a and the position of the contact is shifted to the second gate electrode side, a short-circuit between the second gate electrode and the contact is prevented.

As described above, the fourth step of forming a third insulating film sidewall 202 on a side wall of the first insulating film sidewall 201, a side wall of the second insulating film sidewall 200, a side wall of the first gate electrode 117b, a side wall of the second gate electrode 117a, and a side wall of the gate line 117c is conducted.

(Fifth Step)

Next, a fifth step of forming a silicide on the first n-type diffusion layer 119, the second n-type diffusion layer 120, the first p-type diffusion layer 125, the second p-type diffusion layer 126, and the gate line 117c will be described.

First, as illustrated in FIG. 35, a metal such as nickel or cobalt is deposited and heat-treated and unreacted metal is removed. Thus, silicides 133, 134, 135, 136, 132, 131, and 137 are formed on the first n-type diffusion layer 119, the second n-type diffusion layer 120, the first p-type diffusion layer 125, the second p-type diffusion layer 126, and the gate line 117c. In this step, the second n-type diffusion layer 120 and the second p-type diffusion layer 126 are connected by the silicides 134 and 135. In the case where an output terminal of an inverter is not formed in a lower portion of a silicon pillar, the connection between the second n-type diffusion layer 120 and the second p-type diffusion layer 126 through the silicides may be omitted.

As described above, the fifth step of forming a silicide on the first n-type diffusion layer 119, the second n-type diffusion layer 120, the first p-type diffusion layer 125, the second p-type diffusion layer 126, and the gate line 117c is conducted.

Figure 36:
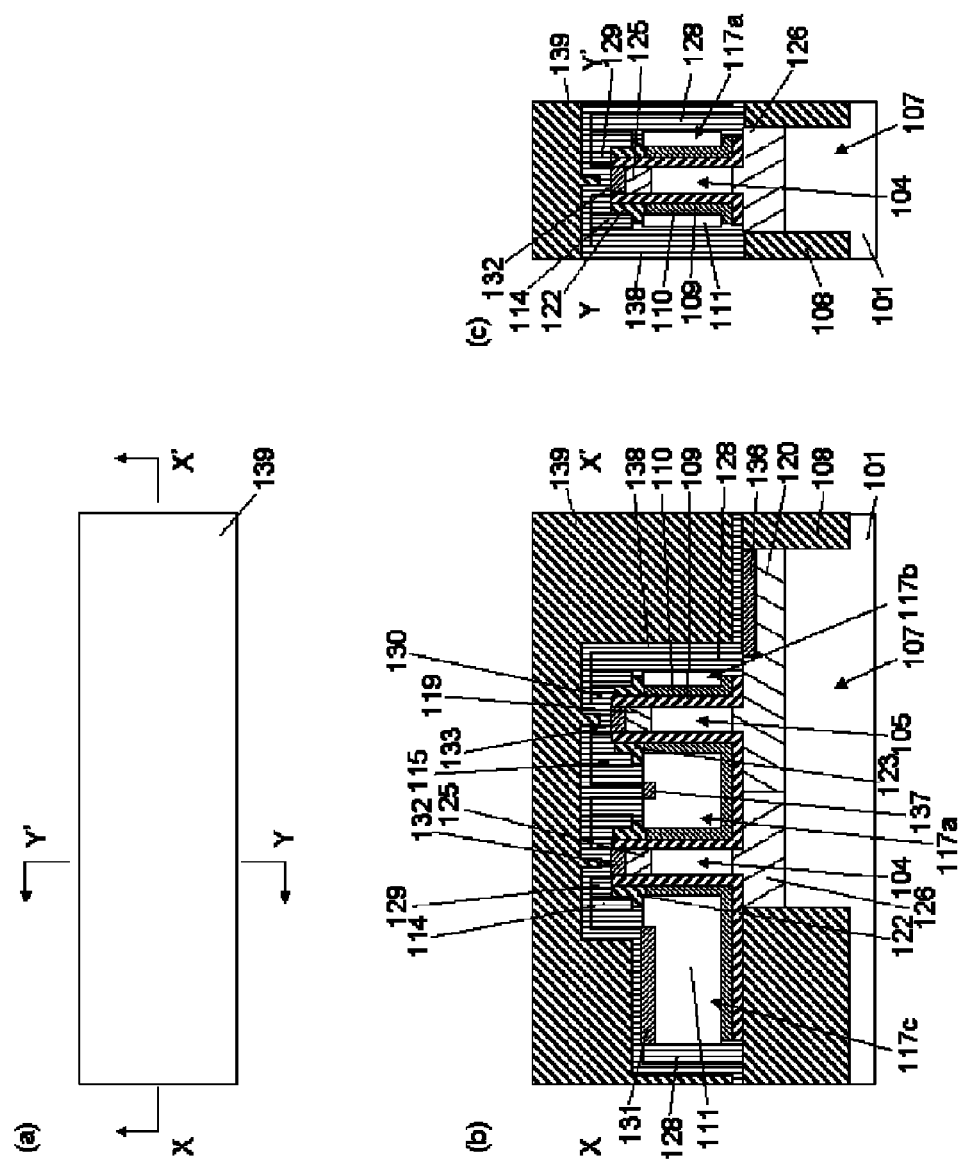
FIG. 36(a) is a plan view illustrating the method for producing a semiconductor device according to the embodiment.
FIG. 36(b) is a cross-sectional view taken along line X-X' of FIG. 36(a)
FIG. 36(c) is a cross-sectional view taken along line Y-Y' of FIG. 36(a)

Next, as illustrated in FIG. 36, a third nitride film 138 is deposited, and an interlayer insulating film 139 is further deposited and the surface of the interlayer insulating film 139 is planarized.

Subsequently, as illustrated in FIG. 37, a sixth resist 140 for forming contacts on the first pillar-shaped silicon layer 105 and the second pillar-shaped silicon layer 104 is formed.

Subsequently, as illustrated in FIG. 38, the interlayer insulating film 139 is etched to form contact holes 141 and 142.

Figure 39:
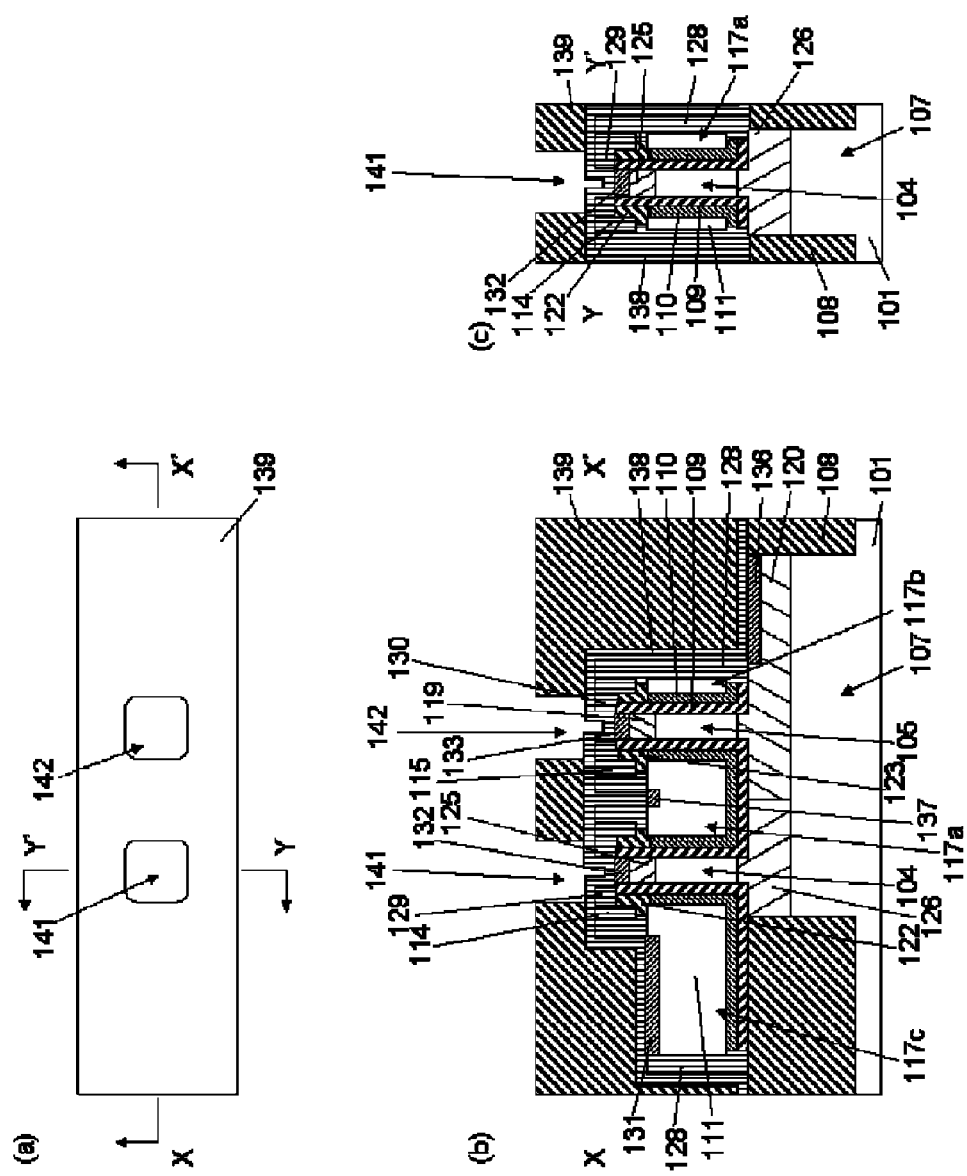
FIG. 39(a) is a plan view illustrating the method for producing a semiconductor device according to the embodiment.
FIG. 39(b) is a cross-sectional view taken along line X-X' of FIG. 39(a)
FIG. 39(c) is a cross-sectional view taken along line Y-Y' of FIG. 39(a)

Subsequently, as illustrated in FIG. 39, the sixth resist 140 is removed.

Figure 40:
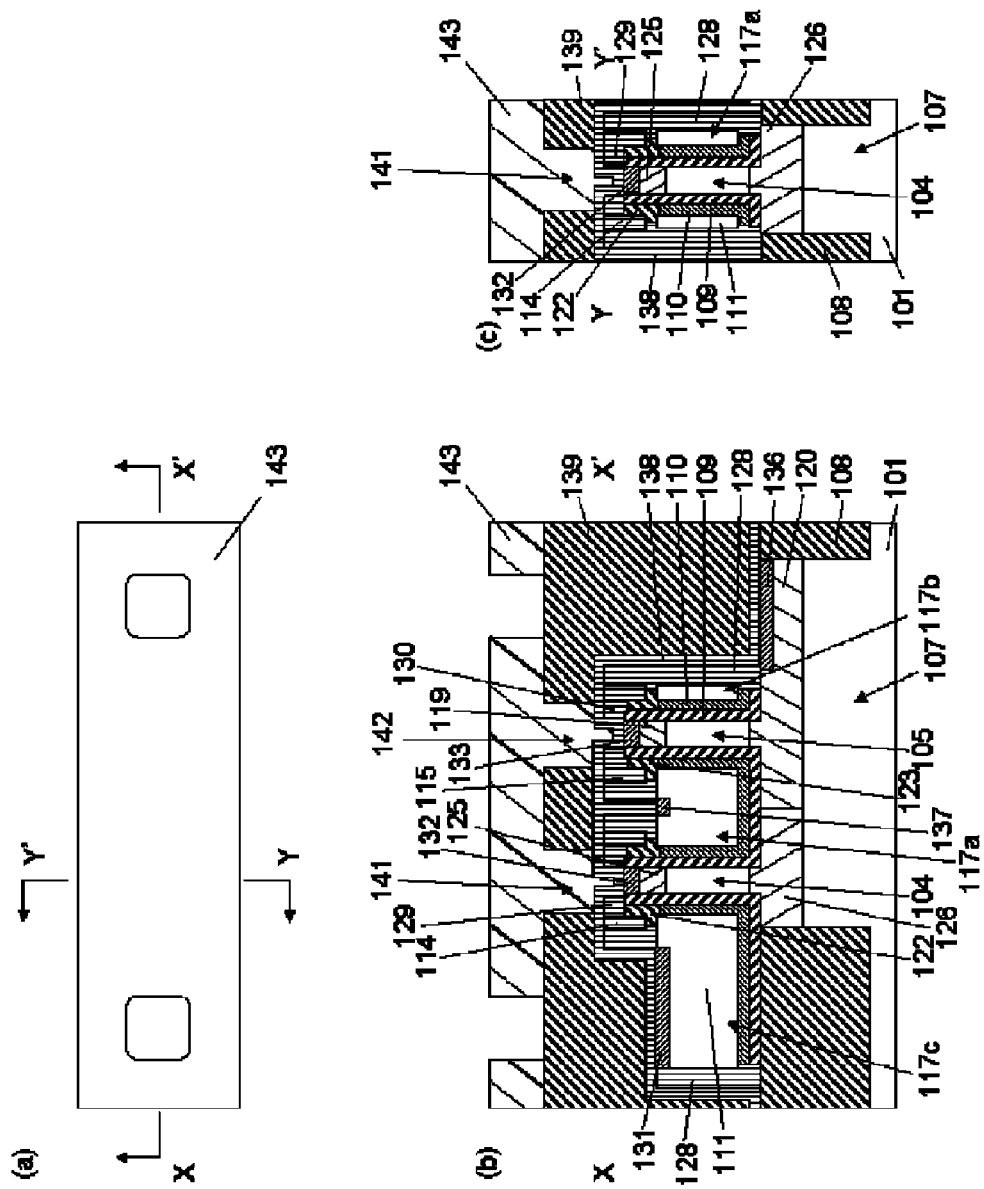
FIG. 40(a) is a plan view illustrating the method for producing a semiconductor device according to the embodiment.
FIG. 40(b) is a cross-sectional view taken along line X-X' of FIG. 40(a)

Subsequently, as illustrated in FIG. 40, a seventh resist 143 for forming contacts on the gate line 117c and the planar silicon layer 107 is formed.

Figure 41:
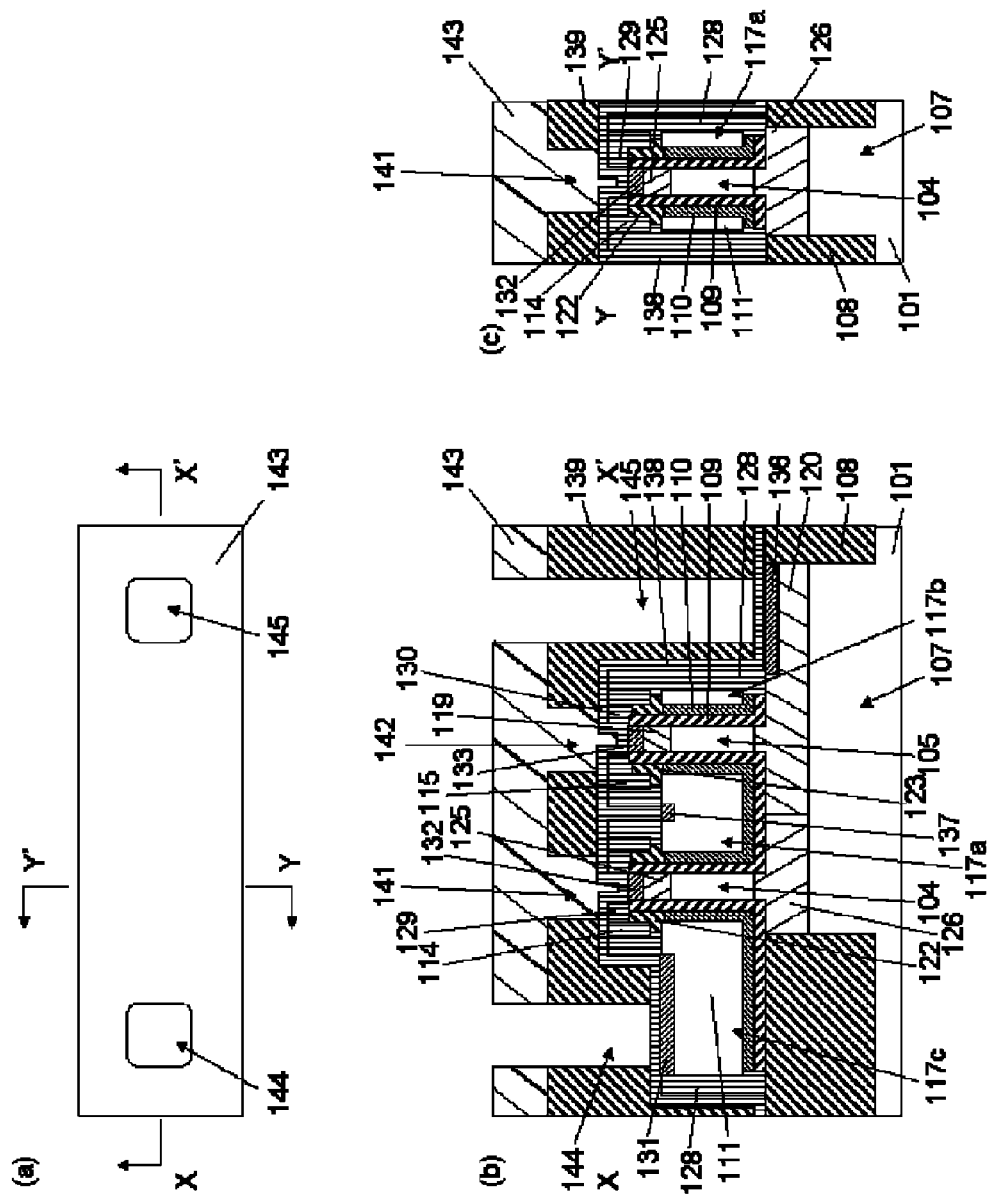

Subsequently, as illustrated in FIG. 41, the interlayer insulating film 139 is etched to form contact holes 144 and 145.

Subsequently, as illustrated in FIG. 42, the seventh resist 143 is removed.

Figure 43:
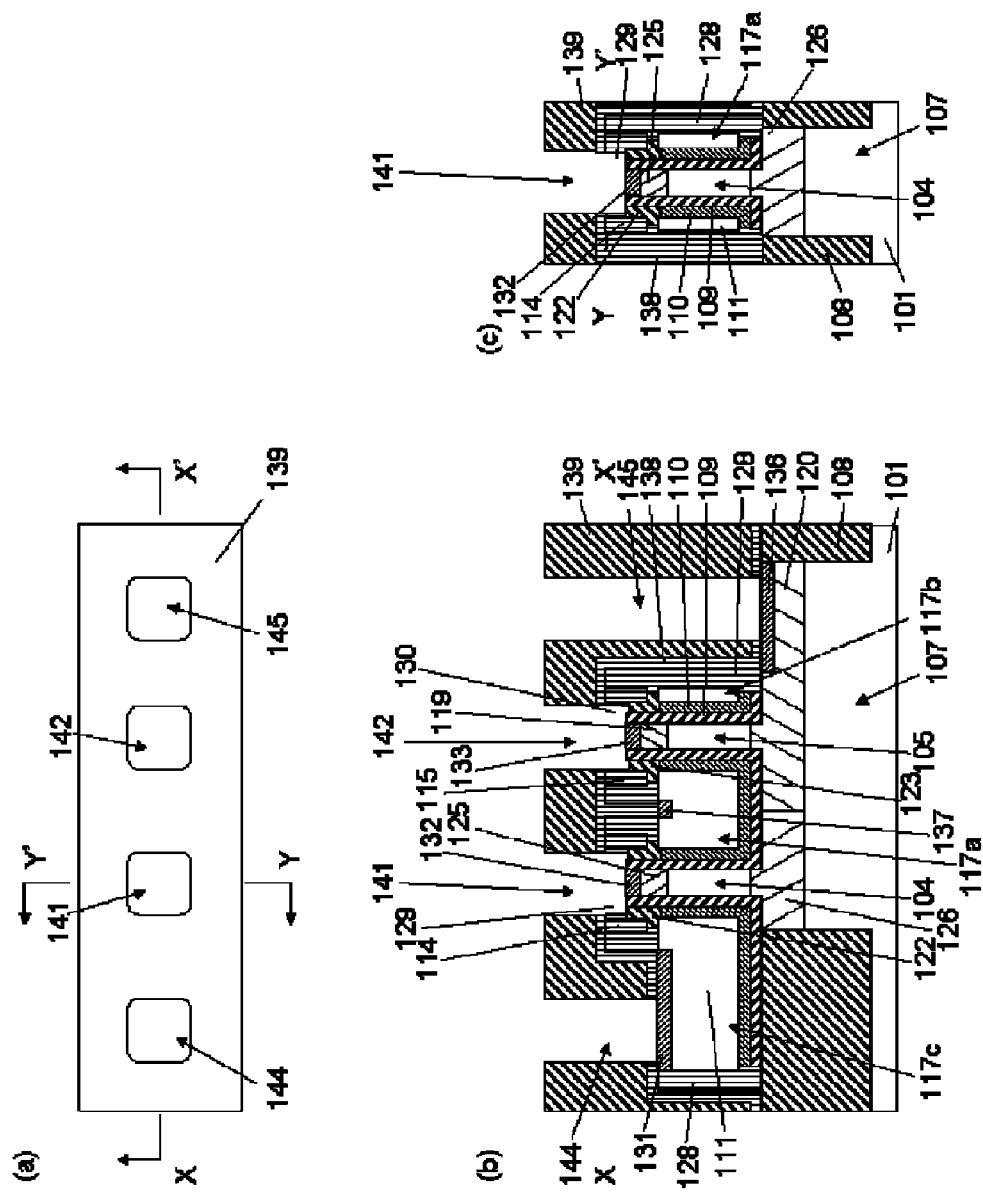

Subsequently, as illustrated in FIG. 43, the third nitride film 138 is etched.

Figure 44:
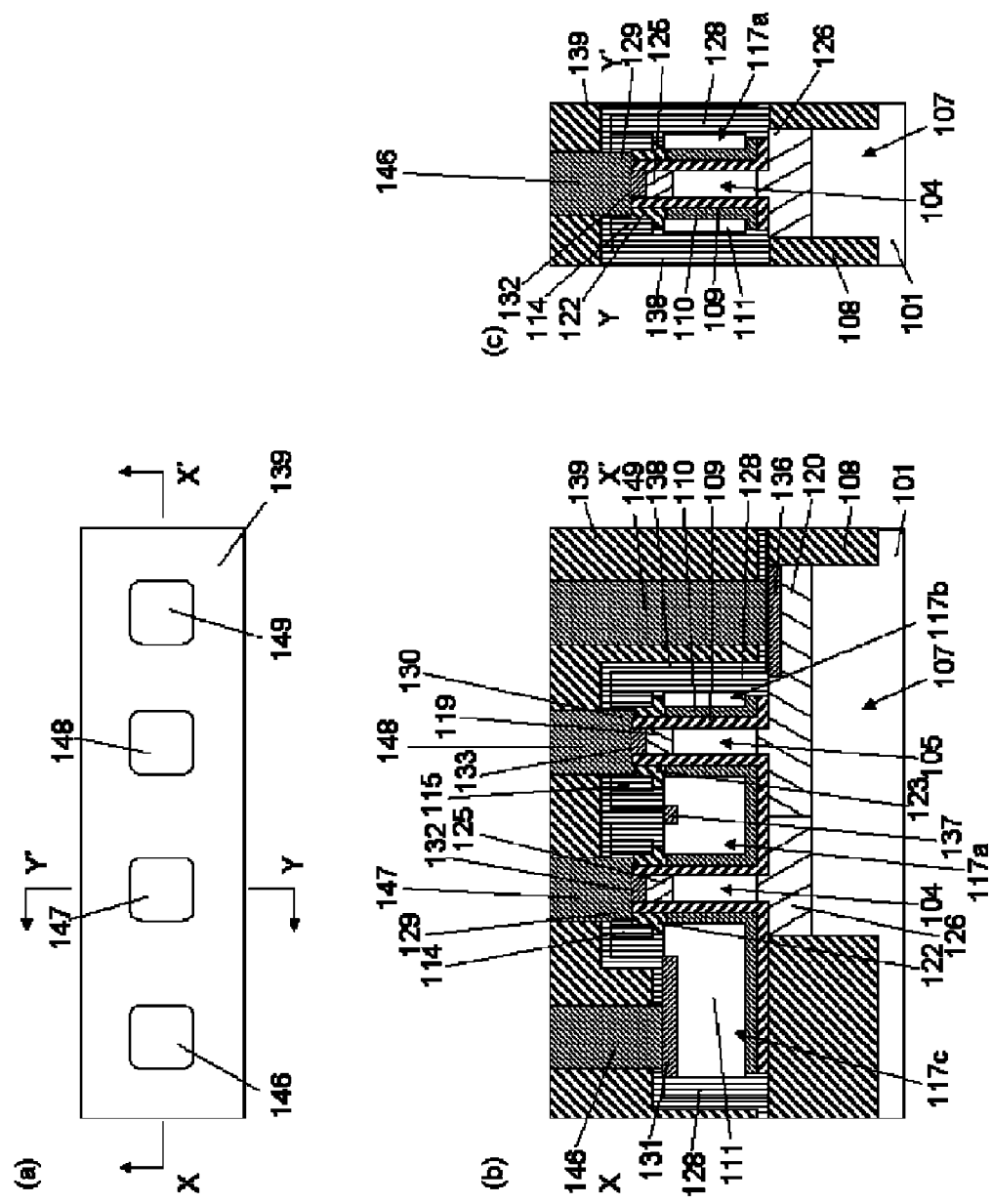

Subsequently, as illustrated in FIG. 44, a metal is deposited to form contacts 146, 147, 148, and 149.

Figure 45:
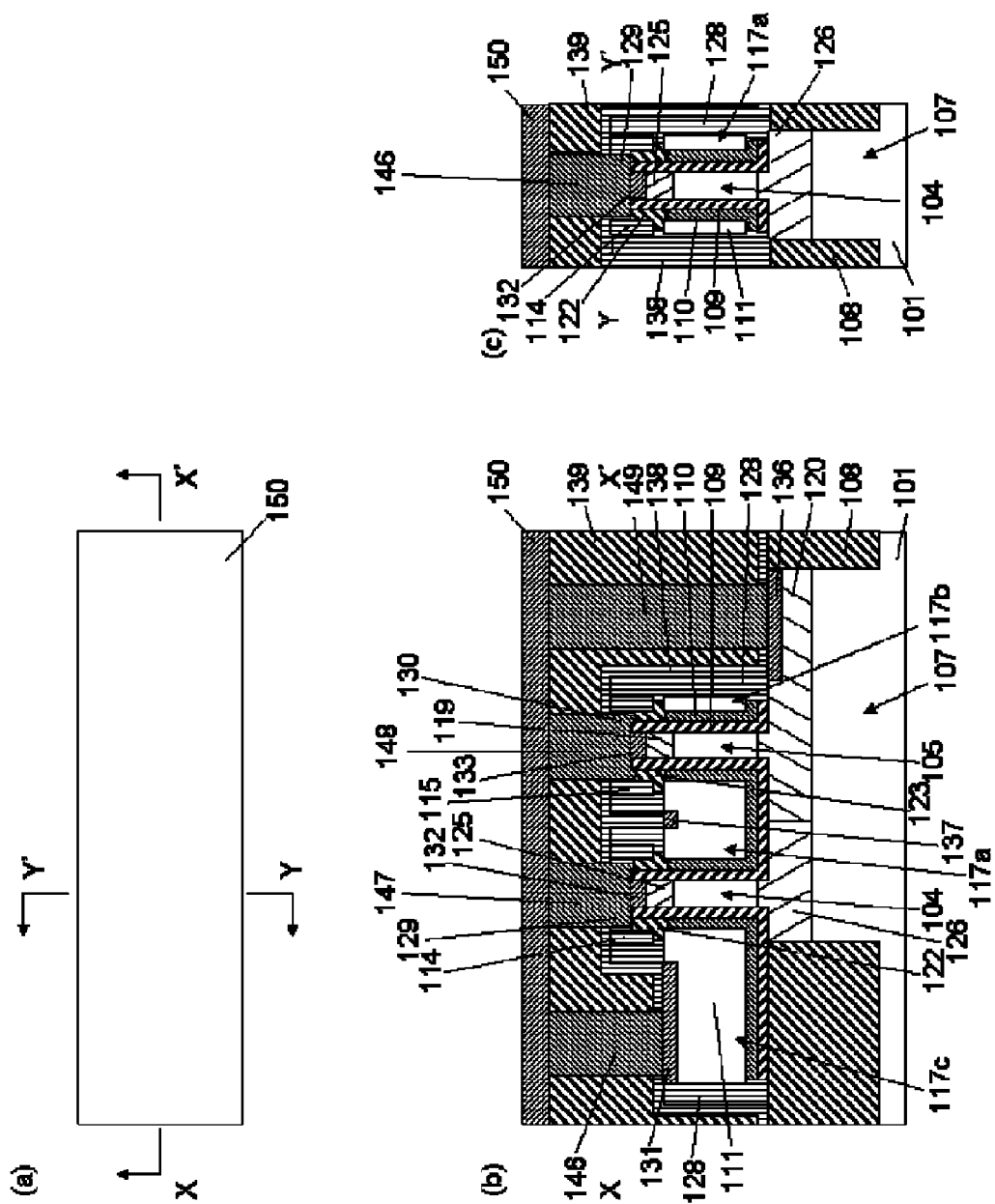

Subsequently, as illustrated in FIG. 45, a metal 150 for forming metal wirings is deposited.

Subsequently, as illustrated in FIG. 46, an eighth resists 151, 152, 153, and 154 are formed in order to form the metal wirings.

Figure 47:
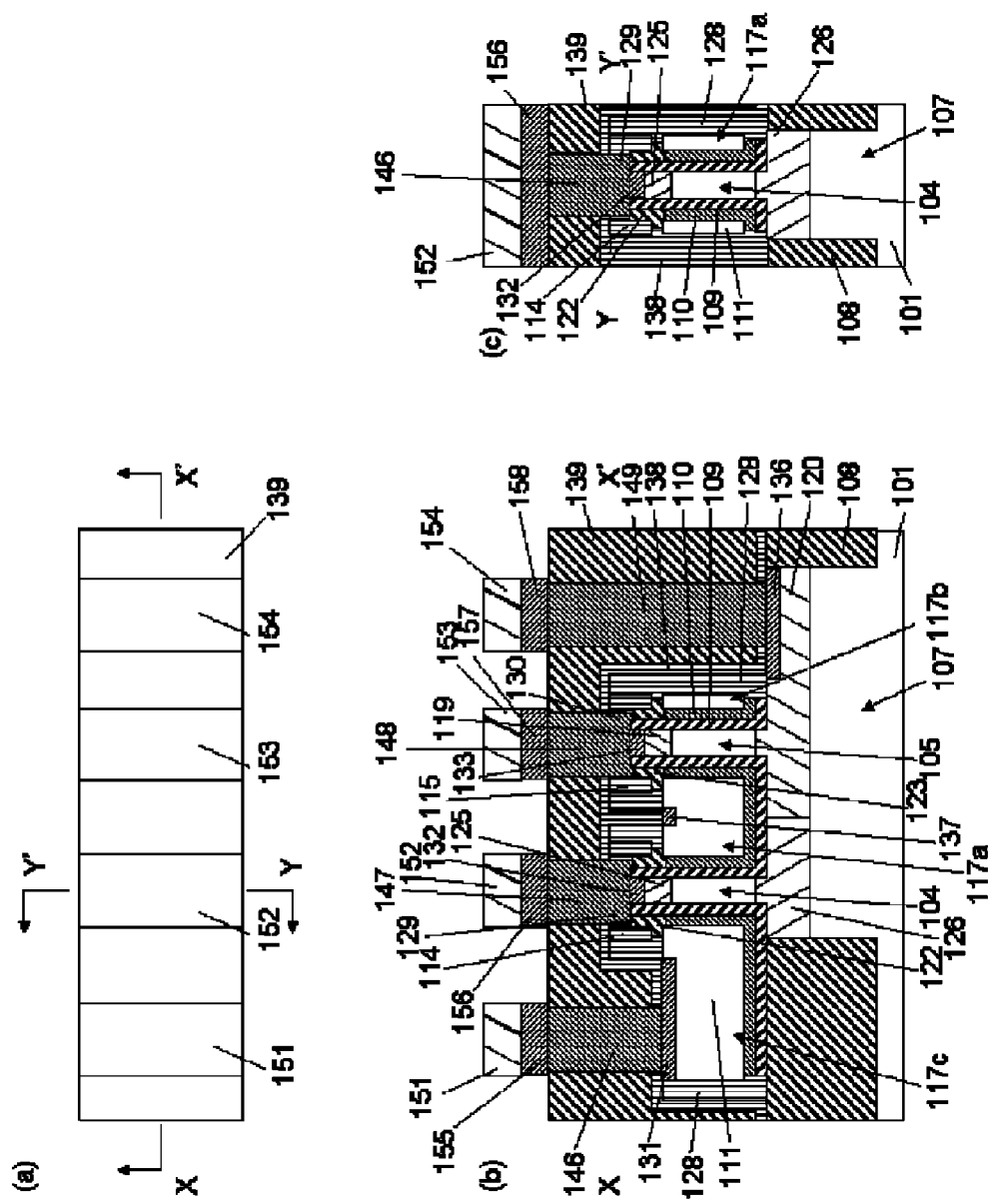

Subsequently, as illustrated in FIG. 47, the metal 150 is etched to form metal wirings 155, 156, 157, and 158.

Subsequently, as illustrated in FIG. 48, the eighth resists 151, 152, 153, and 154 are removed. As described above, a method for producing SGTs is performed in which the number of steps is small and an upper portion of a silicon pillar is protected during etching of a gate.

Figure 1:
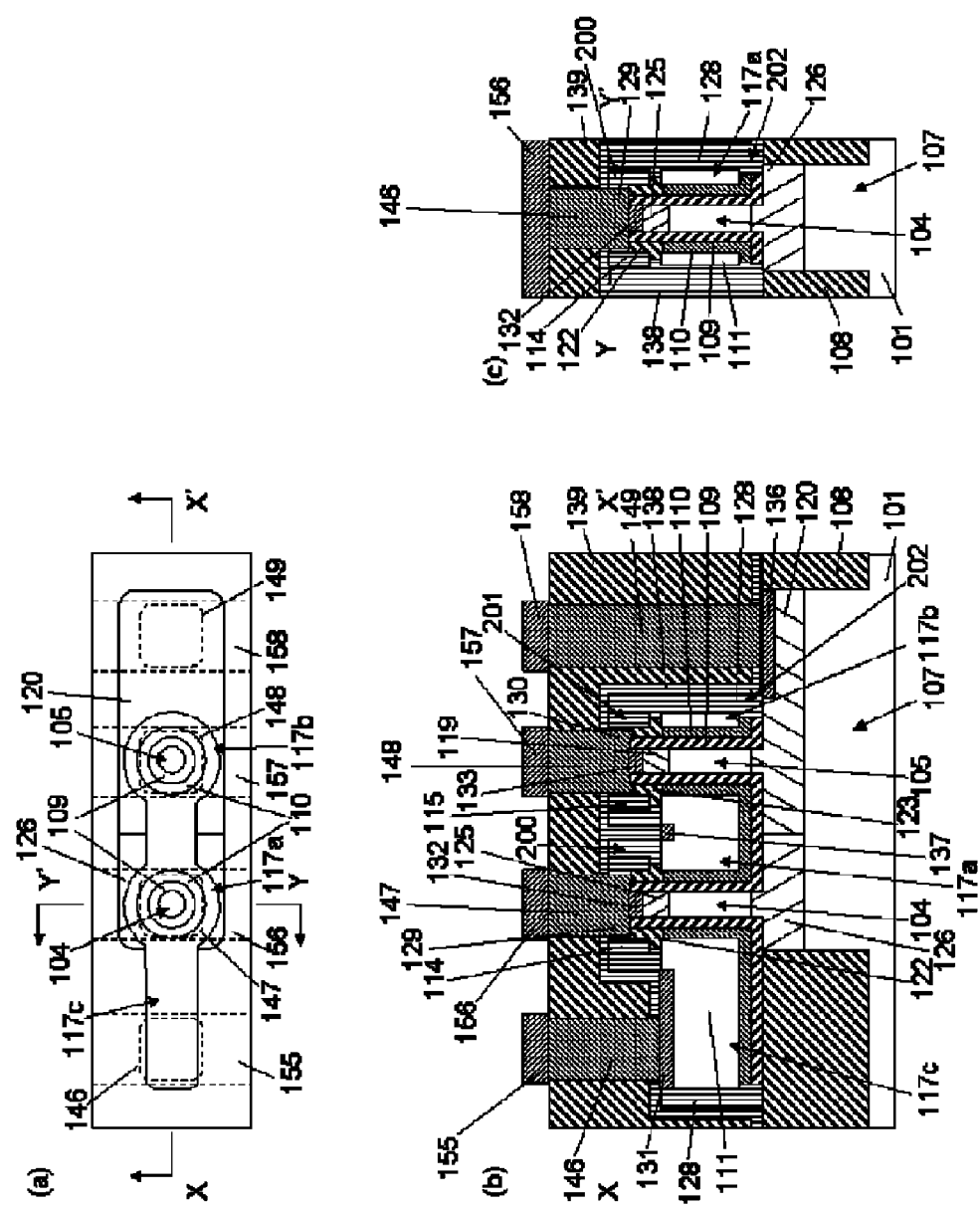
FIG. 1(a) is a plan view of a semiconductor device according to an embodiment of the present invention.
FIG. 1(b) is a cross-sectional view taken along line X-X' of FIG. 1(a)
FIG. 1(c) is a cross-sectional view taken along line Y-Y' of FIG. 1(a)

FIG. 1 illustrates the structure of the semiconductor device produced by the method described above. As illustrated in FIG. 1, a semiconductor device includes a planar silicon layer 107 formed on a silicon substrate 101; a first pillar-shaped silicon layer 105 formed on the planar silicon layer 107; a second pillar-shaped silicon layer 104 formed on the planar silicon layer 107; a gate insulating film 109 formed around the first pillar-shaped silicon layer 105; a first gate electrode 117b having a laminated structure of a metal film 110 and a polysilicon 111 and formed around the gate insulating film 109; a gate insulating film 109 formed around the second pillar-shaped silicon layer 104; a second gate electrode 117a having a laminated structure of a metal film 110 and a polysilicon 111 and formed around the gate insulating film 109; a gate line 117c connected to the first gate electrode 117b and the second gate electrode 117a; a first n-type diffusion layer 119 formed in an upper portion of the first pillar-shaped silicon layer 105; a second n-type diffusion layer 120 formed in a lower portion of the first pillar-shaped silicon layer 105 and in an upper portion of the planar silicon layer 107; a first p-type diffusion layer 125 formed in an upper portion of the second pillar-shaped silicon layer 104; a second p-type diffusion layer 126 formed in a lower portion of the second pillar-shaped silicon layer 104 and in an upper portion of the planar silicon layer 107; a first insulating film sidewall 201 formed on an upper side wall of the first pillar-shaped silicon layer 105 and on an upper portion of the first gate electrode 117b; a second insulating film sidewall 200 formed on an upper side wall of the second pillar-shaped silicon layer 104 and on an upper portion of the second gate electrode 117a; a third insulating film sidewall 202 formed on a side wall of the first insulating film sidewall 201, a side wall of the second insulating film sidewall 200, a side wall of the first gate electrode 117b, a side wall of the second gate electrode 117a, and a side wall of the gate line 117c; and silicides 133, 134, 135, 136, 132, 131, and 137 formed on the first n-type diffusion layer 119, the second n-type diffusion layer 120, the first p-type diffusion layer 125, the second p-type diffusion layer 126, and the gate line 117c.

In this structure, an upper portion of the first gate electrode 117b is covered with the first insulating film sidewall 201 and the side wall of the first gate electrode 117b is coveted with the third insulating film sidewall 202. In addition, the side wall of the first insulating film sidewall 201 is covered with the third insulating film sidewall 202. Accordingly, if the position of a contact 149 formed on a diffusion layer in an upper portion of the planar silicon layer is shifted to the first gate electrode 117b side, a short-circuit between the first gate electrode 117b and the contact 149 can be prevented. Similarly, an upper portion of the second gate electrode 117a is covered with the second insulating film sidewall 200, and the side wall of the second gate electrode 117a is covered with the third insulating film sidewall 202. In addition, the side wall of the second insulating film sidewall 200 is covered with the third insulating film sidewall 202. Accordingly, in the case where a contact formed on a diffusion layer in an upper portion of the planar silicon layer is formed in the vicinity of the second gate electrode 117a and the position of the contact is shifted to the second gate electrode 117a side, a short-circuit between the second gate electrode 117a and the contact can be prevented.

It is to be understood that various embodiments and modifications of the present invention can be made without departing from the broad spirit and scope of the present invention. The embodiments described above are illustrative examples of the present invention and do not limit the scope of the present invention.

For example, in the above embodiments, a method for producing a semiconductor device in which the p type (including the p$^+$ type) and the n type (including the n$^+$ type) are each changed to the opposite conductivity type, and a semiconductor device produced by the method are also included in the technical scope of the present invention.

The invention claimed is:

1. A method of producing a semiconductor device, the method which comprises:
   a first step of forming a planar silicon layer on a silicon substrate, and forming a first pillar-shaped silicon layer and a second pillar-shaped silicon layer on the planar silicon layer;
   a second step, subsequent to the first step, of forming a gate insulating film around the first and second pillar-shaped silicon layers, depositing a metal film and a polysilicon around the gate insulating film, conducting planarization, and conducting etching to expose upper portions of the first and second pillar-shaped silicon layers, forming a first insulating film sidewall on an upper side wall of the first pillar-shaped silicon layer, forming a second insulating film sidewall on an upper side wall of the second pillar-shaped silicon layer, forming, around the gate insulating film, a first gate electrode and a second gate electrode each having a laminated structure of the metal film and the polysilicon, and forming a gate line connected to the first gate electrode and the second gate electrode;

a third step, subsequent to the second step, of forming a first n-type diffusion layer in an upper portion of the first pillar-shaped silicon layer, forming a second n-type diffusion layer in a lower portion of the first pillar-shaped silicon layer and an upper portion of the planar silicon layer, forming a first p-type diffusion layer in an upper portion of the second pillar-shaped silicon layer, and forming a second p-type diffusion layer in a lower portion of the second pillar-shaped silicon layer and an upper portion of the planar silicon layer;

a fourth step, subsequent to the third step, of forming a third insulating film sidewall on side walls of the first and second insulating film sidewalls, side walls of the first and second gate electrodes, and a side wall of the gate line; and a fifth step, subsequent to the fourth step, of forming a silicide on the first and second n-type diffusion layers, the first and second p-type diffusion layers, and the gate line.

2. The method of producing a semiconductor device according to claim 1, which comprises:

forming a first resist for forming the first and second pillar-shaped silicon layers on the silicon substrate, etching the silicon substrate to form the first and second pillar-shaped silicon layers, removing the first resist, forming a second resist for forming the planar silicon layer, etching the silicon substrate to form the planar silicon layer, and removing the second resist.

3. The method for producing a semiconductor device according to claim 1, wherein:

in a structure including the planar silicon layer formed on the silicon substrate, the first pillar-shaped silicon layer formed on the planar silicon layer, the second pillar-shaped silicon layer formed on the planar silicon layer, and a first insulating film formed around the planar silicon layer, the gate insulating film is formed around the first and second pillar-shaped silicon layers;

a metal film is formed around the gate insulating film, a polysilicon is deposited and planarized, the polysilicon is etched to expose the metal film, and the polysilicon is etched to expose upper portions of the first and second pillar-shaped silicon layers;

the metal film is etched, a second oxide film and a first nitride film are deposited, and the first nitride film is etched to remain in a sidewall shape to form a nitride film sidewall;

the second oxide film and the nitride film sidewall function as the first and second insulating film sidewalls;

in order to form the first and second gate electrodes and the gate line, a third resist is formed so as to cover upper portions of the first and second pillar-shaped silicon layers; and the second oxide film is etched, the polysilicon is etched, and the metal film is etched to form the first and second gate electrodes and the gate line, and the third resist is then removed.

4. The method for producing a semiconductor device according to claim 3, wherein:

a fourth resist for forming a first n-type diffusion layer and a second n-type diffusion layer is formed, arsenic is implanted to form the first and second n-type diffusion layers, the fourth resist is removed, a third oxide film is deposited, and heat treatment is then conducted;

the third oxide film is removed, the second oxide film and the gate insulating film are etched such that the second oxide film remains around the first and second pillar-shaped silicon layers to function as an oxide film sidewall;

the oxide film sidewall and the nitride film sidewall function as the first insulating film sidewall, and the oxide film sidewall and the nitride film sidewall function as the second insulating film sidewall; and a fifth resist for forming a first p-type diffusion layer and a second p-type diffusion layer is formed, boron is implanted to form the first and second p-type diffusion layers, the fifth resist is removed, and heat treatment is then conducted.

5. The method for producing a semiconductor device according to claim 4, which comprises further depositing a second nitride film, and etching the second nitride film so as to remain in a sidewall shape to form a nitride film sidewall functioning as the third insulating film sidewall.

6. A semiconductor device, comprising:

a planar silicon layer formed on a silicon substrate;

first and second pillar-shaped silicon layers formed on the planar silicon layer;

a first gate insulating film formed around the first pillar-shaped silicon layer;

a first gate electrode having a laminated structure of a metal film and a polysilicon and formed around the first gate insulating film;

a second gate insulating film formed around the second pillar-shaped silicon layer;

a second gate electrode having a laminated structure of a metal film and a polysilicon and formed around the second gate insulating film;

a gate line connected to the first and second gate electrodes;

a first n-type diffusion layer formed in an upper portion of the first pillar-shaped silicon layer;

a second n-type diffusion layer formed in a lower portion of the first pillar-shaped silicon layer and in an upper portion of the planar silicon layer;

a first p-type diffusion layer formed in an upper portion of the second pillar-shaped silicon layer;

a second p-type diffusion layer formed in a lower portion of the second pillar-shaped silicon layer and in an upper portion of the planar silicon layer;

a first insulating film sidewall formed on an upper side wall of the first pillar-shaped silicon layer and on an upper portion of the first gate electrode;

a second insulating film sidewall formed on an upper side wall of the second pillar-shaped silicon layer and on an upper portion of the second gate electrode;

a third insulating film sidewall formed on side walls of the first and second insulating film sidewalls, side walls of the first and second gate electrodes, and a side wall of the gate line; and a silicide formed on the first and second n-type diffusion layers, the first and second p-type diffusion layers, and the gate line.

* * * * *